United States Patent
Sharangpani et al.

(10) Patent No.: US 12,484,222 B2
(45) Date of Patent: Nov. 25, 2025

(54) THREE-DIMENSIONAL MEMORY DEVICE AND METHOD OF MAKING THEREOF BY NON-CONFORMAL SELECTIVE DEPOSITION OF INSULATING SPACERS IN A MEMORY OPENING

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Adarsh Rajashekhar, Santa Clara, CA (US); Fei Zhou, San Jose, CA (US); Bing Zhou, San Jose, CA (US); Senaka Kanakamedala, San Jose, CA (US); Roshan Jayakhar Tirukkonda, Milpitas, CA (US); Kartik Sondhi, Milpitas, CA (US)

(73) Assignee: Sandisk Technologies, Inc., Milpitas, CA (US)

(*) Notice: Subject to any disclaimer, the term of this patent is extended or adjusted under 35 U.S.C. 154(b) by 391 days.

(21) Appl. No.: 18/355,888

(22) Filed: Jul. 20, 2023

(65) Prior Publication Data

US 2024/0237346 A1 Jul. 11, 2024

Related U.S. Application Data

(60) Provisional application No. 63/479,455, filed on Jan. 11, 2023.

(51) Int. Cl.
*H10B 43/27* (2023.01)
*H01L 23/522* (2006.01)
(Continued)

(52) U.S. Cl.
CPC .......... *H10B 43/27* (2023.02); *H01L 23/5226* (2013.01); *H01L 23/5283* (2013.01);
(Continued)

(58) Field of Classification Search
CPC ........ H10B 41/27; H10B 43/10; H10B 43/27; H10B 43/50; H10B 41/10; H10B 41/35;
(Continued)

(56) References Cited

U.S. PATENT DOCUMENTS 9,768,192 B1 9/2017 Nakamura
9,780,034 B1 10/2017 Tsutsumi et al.
(Continued)

OTHER PUBLICATIONS

Dvorak, F. et al., "One-dimensional anodic TiO2nanotubes coated by atomic layer deposition: Towards advanced applications," Applied Materials Today, vol. 14, (2019) pp. 1-20, https://doi.org/10.1016/j.apmt.2018.11.005.
(Continued)

*Primary Examiner* — Jaehwan Oh
(74) *Attorney, Agent, or Firm* — THE MARBURY LAW GROUP PLLC

(57) ABSTRACT

A method of forming a memory device includes forming an alternating stack of insulating layers including a first insulating material and sacrificial material layers including a first sacrificial material over a substrate, forming a memory opening through the alternating stack, performing a first selective material deposition process that selectively grows a second sacrificial material from physically exposed surfaces of the sacrificial material layers to form a vertical stack of sacrificial material portions; forming a memory opening fill structure in the memory opening, where the memory opening fill structure includes a vertical stack of memory elements and a vertical semiconductor channel, and replacing a combination of the vertical stack of sacrificial material
(Continued)

portions and the sacrificial material layers with electrically conductive layers.

20 Claims, 28 Drawing Sheets

(51) Int. Cl.
  *H01L 23/528* (2006.01)
  *H10B 41/10* (2023.01)
  *H10B 41/27* (2023.01)
  *H10B 41/35* (2023.01)
  *H10B 43/10* (2023.01)
  *H10B 43/35* (2023.01)

(52) U.S. Cl.
  CPC ............. *H10B 41/10* (2023.02); *H10B 41/27* (2023.02); *H10B 41/35* (2023.02); *H10B 43/10* (2023.02); *H10B 43/35* (2023.02)

(58) Field of Classification Search
  CPC .. H10B 43/35; H01L 23/5226; H01L 23/5283
  See application file for complete search history.

(56) References Cited

U.S. PATENT DOCUMENTS

| | | | |
|---|---|---|---|
| 9,960,180 B1 | 5/2018 | Zhou et al. | |
| 10,192,878 B1 | 1/2019 | Tsutsumi et al. | |
| 10,242,994 B2 | 3/2019 | Inomata et al. | |
| 10,256,252 B1 * | 4/2019 | Kanazawa | H01L 21/0217 |
| 10,847,376 B2 | 11/2020 | Osawa et al. | |
| 11,380,707 B2 | 7/2022 | Matsuno et al. | |
| 11,398,496 B2 | 7/2022 | Kai et al. | |
| 11,489,043 B2 | 11/2022 | Kai et al. | |
| 2017/0271261 A1 | 9/2017 | Tsutsumi et al. | |
| 2017/0271352 A1 | 9/2017 | Nakamura | |
| 2018/0006049 A1 | 1/2018 | Inomata et al. | |
| 2020/0006080 A1 | 1/2020 | Osawa et al. | |
| 2022/0045091 A1 * | 2/2022 | Cui | H01L 21/32135 |
| 2022/0344365 A1 | 10/2022 | Fujimura et al. | |
| 2024/0206172 A1 * | 6/2024 | Kang | H01L 21/68707 |

OTHER PUBLICATIONS

Gayle, A. J. et al., "Tunable Atomic Layer Deposition into Ultra-High-Aspect-Ratio (>60000:1) Aerogel Monoliths Enabled by Transport Modeling," Chem. Mater. 2021, vol. 33, pp. 5572-5583, https://pubs.acs.org/action/showCitFormats?doi=10.1021/acs.chemmater.1c00770&ref=pdf.

Szmyt, W. et al., "Atomic Layer Deposition on Porous Substrates: From General Formulation to Fibrous Substrates and Scaling Laws," Chem. Mater. 2022, vol. 34, pp. 203-216, https://pubs.acs.org/action/showCitFormats?doi=10.1021/acs.chemmater.1c03164&ref=pdf.

Endoh, T. et al., "Novel Ultra High-Density Memory with a Stacked-Surrounding Gate Transistor (S-SGT) Structured Cell," IEDM Proc., (2001), 33-36.

U.S. Appl. No. 17/587,470, filed Jan. 28, 2022, SanDisk Technologies LLC.

U.S. Appl. No. 17/587,518, filed Jan. 28, 2022, SanDisk Technologies LLC.

* cited by examiner

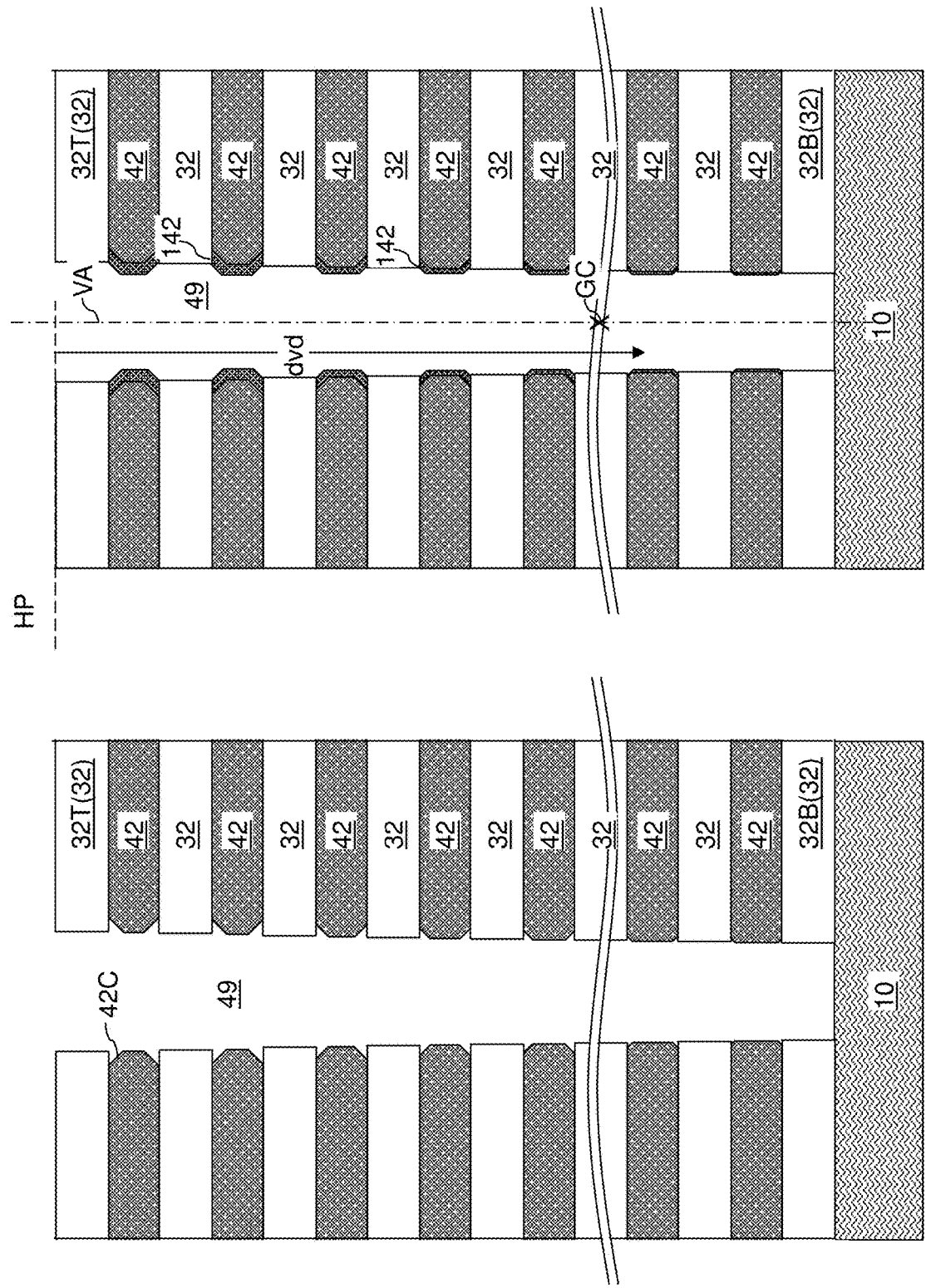

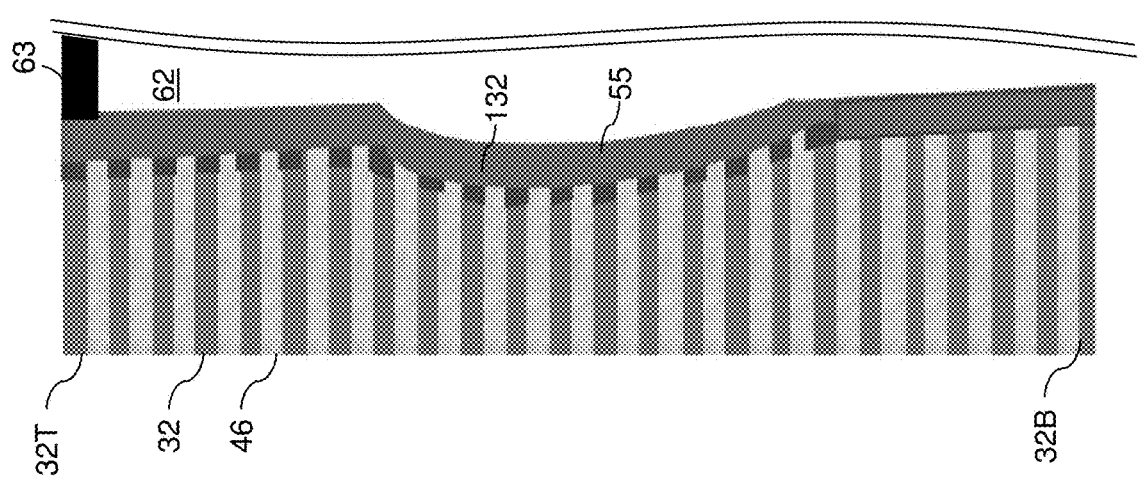

THREE-DIMENSIONAL MEMORY DEVICE AND METHOD OF MAKING THEREOF BY NON-CONFORMAL SELECTIVE DEPOSITION OF INSULATING SPACERS IN A MEMORY OPENING

FIELD

The present disclosure relates generally to the field of semiconductor devices, and particularly to a three-dimensional memory device and method of making thereof by selective deposition processes.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers located over a substrate; a memory opening vertically extending through the alternating stack; and a memory opening fill structure located in the memory opening and comprising a vertical stack of memory elements and a vertical semiconductor channel, wherein each electrically conductive layer within an upper subset of the electrically conductive layers including a topmost electrically conductive layer comprises a respective cylindrical surface that laterally surrounds the memory opening fill structure, an upper tapered annular surface adjoined to an upper periphery of the respective cylindrical surface, and a lower tapered annular surface adjoined to a lower periphery of the respective cylindrical surface.

According to another aspect of the present disclosure, a method of forming a memory device includes forming an alternating stack of insulating layers including a first insulating material and sacrificial material layers including a first sacrificial material over a substrate, forming a memory opening through the alternating stack, performing a first selective material deposition process that selectively grows a second sacrificial material from physically exposed surfaces of the sacrificial material layers to form a vertical stack of sacrificial material portions; forming a memory opening fill structure in the memory opening, where the memory opening fill structure includes a vertical stack of memory elements and a vertical semiconductor channel, and replacing a combination of the vertical stack of sacrificial material portions and the sacrificial material layers with electrically conductive layers.

BRIEF DESCRIPTION OF THE DRAWINGS

FIGS. 5A-5H are sequential schematic vertical cross-sectional views of a memory opening within the first exemplary structure during formation of a memory opening fill structure according to the first embodiment of the present disclosure.

FIGS. 9B and 9C are magnified views of alternative regions around a memory opening fill structure of the first exemplary structure of FIG. 9A.

DETAILED DESCRIPTION

Figure 1:
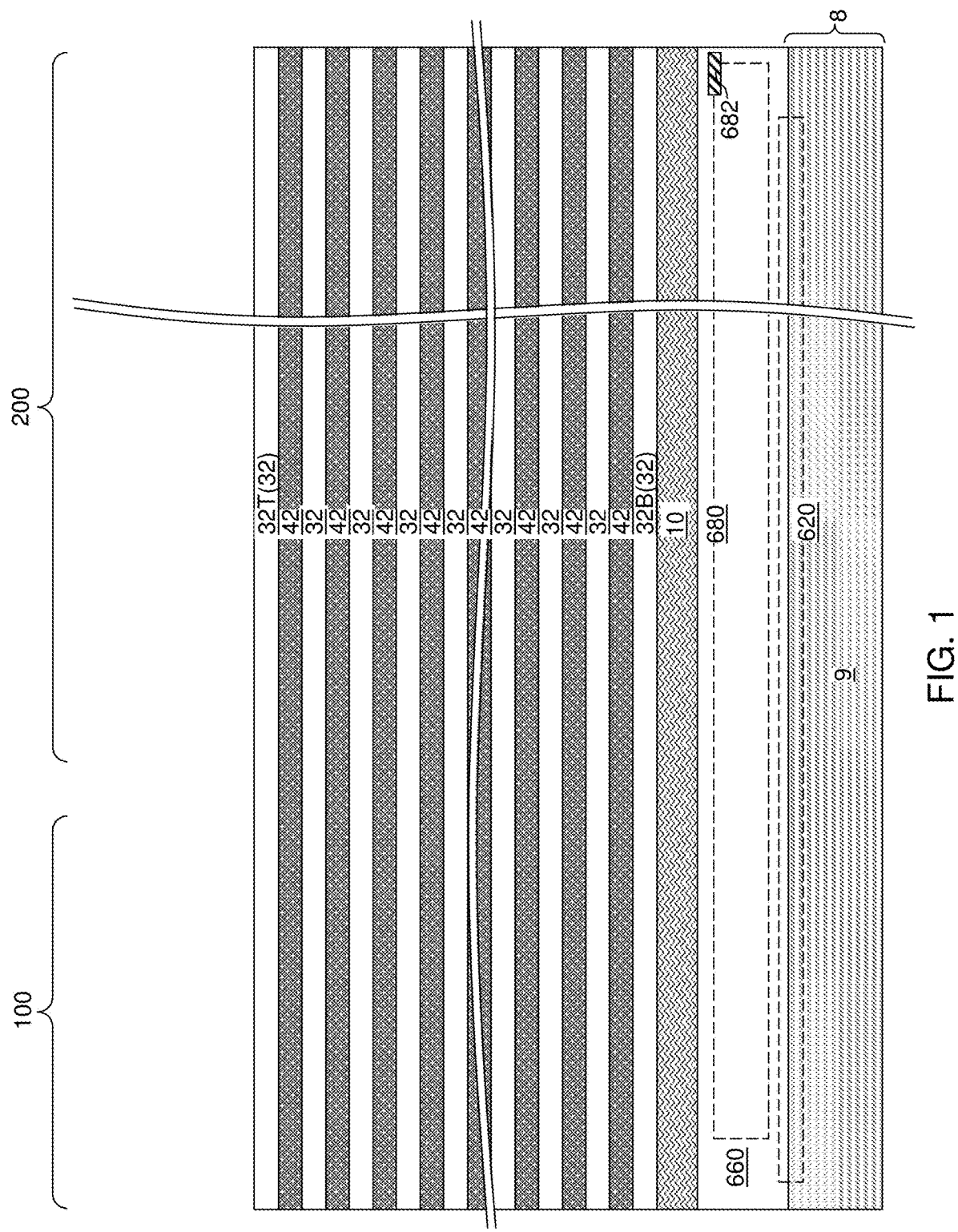
FIG. 1 is a schematic vertical cross-sectional view of a first exemplary structure after formation of optional semiconductor devices, optional lower-level metal interconnect structures, a semiconductor material layer, and an alternating stack of insulating layers and sacrificial material layers according to a first embodiment of the present disclosure.

As discussed above, the embodiments of the present disclosure are directed to a three-dimensional memory device and method of making thereof by a non-conformal selective deposition of insulating spacers in a memory opening, the various aspects of which are described below. The embodiments of the disclosure can be employed to form various structures including a multilevel memory structure, non-limiting examples of which include three-dimensional memory devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated. The first exemplary structure comprises a substrate 8, which may be a semiconductor substrate, an insulating substrate, a conductive substrate, or a combination thereof. In one embodiment, the substrate 8 may comprise a semiconductor substrate consisting essentially of a single crystalline semiconductor material or a polycrystalline semiconductor material. In one embodiment, the substrate 8 may be a portion of a commercially available silicon wafer on which a plurality of semiconductor dies, such as a two-dimensional array of semiconductor dies, can be subsequently formed. The substrate 8 may include a substrate material layer 9, which may or may not be a semiconductor material layer, such as a doped silicon well in a silicon wafer or a silicon layer located on the substrate. Semiconductor devices 620 may be formed on top of the substrate 8. Generally, the semiconductor devices 620 may comprise any type of semiconductor devices known in the art. In one embodiment, the semiconductor devices 620 may comprise complementary metal-oxide-semiconductor (CMOS) field effect transistors. In one embodiment, the semiconductor devices 620 may comprise a peripheral circuit for controlling operation of a three-dimensional memory device to be subsequently formed thereabove.

Optionally, metal interconnect structures 680 embedded within dielectric material layers 660 may be formed above the substrate 8. The metal interconnect structures 680 are also referred to as lower-level metal interconnect structures 680, and the dielectric material layers 660 are also referred to lower-level dielectric material layers 660. In case the semiconductor devices 620 are present, the lower-level metal interconnect structures 680 may provide electrical connection to the semiconductor devices 620. In one embodiment, the metal interconnect structures 680 may comprise metal pads 682, which may be employed as a contact pad for connection via structures to be subsequently formed.

In case the lower-level dielectric material layers 660 are present, a semiconductor material layer 10 may be formed over the lower-level dielectric material layers 660. The semiconductor material layer 10 may comprise a single semiconductor material layer, or may comprise a vertical stack of multiple semiconductor material sublayers. In one embodiment, the semiconductor material layer 10 may have a doping of a first conductivity type, which may be p-type or n-type. In one embodiment, in-process source-level material layers may be formed in lieu of the semiconductor material layer 10. In this case, the in-process source-level material layers may comprise a vertical stack including a lower source semiconductor layer, a source-level sacrificial layer that is subsequently replaced with a source contact layer, and an upper source semiconductor layer. In case the lower-level dielectric material layers 660 are not employed, the semiconductor material layer 10 may be omitted. While an embodiment is described in which a semiconductor material layer 10 is employed, other embodiments are expressly contemplated herein in which the semiconductor material layer is replaced with in-process source-level material layers, or is omitted.

An alternating stack of insulating layers 32 and sacrificial material layers 42 can be formed over the semiconductor material layer 10. The insulating layers 32 comprise a first insulating material such as a silicon-oxide-based insulating material. As used herein, a silicon-oxide-based insulating material refers to an insulating material including undoped silicate glass (e.g., silicon dioxide), a doped silicate glass, organosilicate glass, or silicon oxynitride with or without dopants therein. The sacrificial material layers 42 comprise a first sacrificial material that can be removed selective to the first insulating material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The bottommost layer among the insulating layers 32 is herein referred to as a bottommost insulating layer 32B. The topmost layer among the insulating layers 32 is herein referred to as a topmost insulating layer 32T.

The insulating layers 32 comprise, and/or consist essentially of, the first insulating material. Insulating materials that may be used for the insulating layers 32 include, but are not limited to silicon oxide (including doped or undoped silicate glass), silicon oxynitride, organosilicate glass (OSG), spin-on dielectric materials, etc. In one embodiment, the insulating layers 32 may consist essentially of a silicon oxide.

The first sacrificial material of the sacrificial material layers 42 may comprise an insulating material. In one embodiment, the sacrificial material layers 42 can be spacer material layers that comprise silicon nitride.

The insulating layers 32 and the sacrificial material layers 42 can be deposited, for example, by chemical vapor deposition (CVD). The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed.

The first exemplary structure may comprise a memory array region 100 in which memory stack structures are to be subsequently formed, and a contact region 200 in which stepped surfaces and contact via structures are to be subsequently formed.

Figure 2:
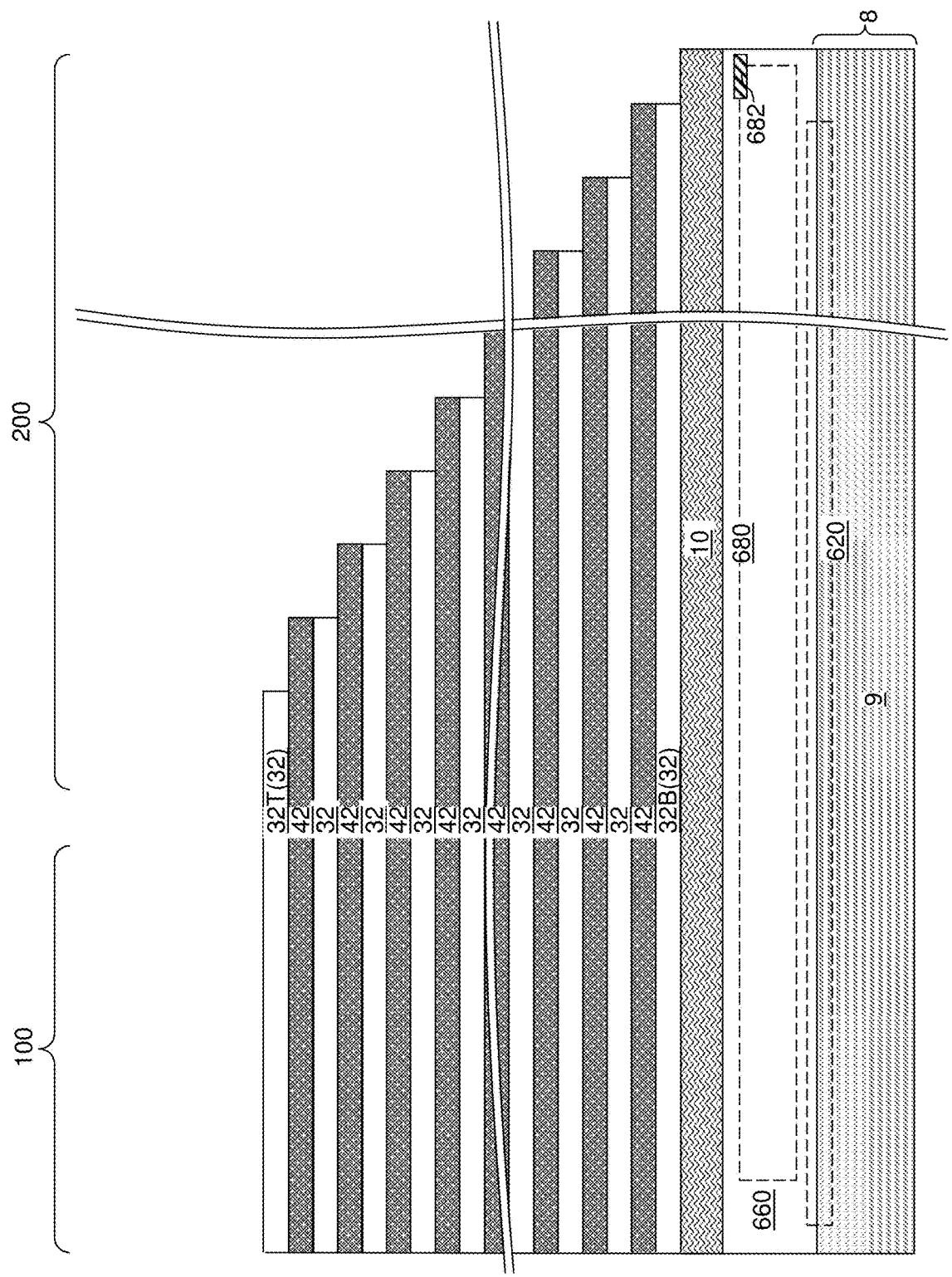
FIG. 2 is a schematic vertical cross-sectional view of the first exemplary structure after formation of stepped terraces according to the first embodiment of the present disclosure.

Referring to FIG. 2, stepped surfaces can be formed in the contact region 200 by patterning the alternating stack (32, 42). As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces. Upon formation of the stepped surfaces, the contact region 200 may be referred to as a staircase region.

The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer 42. In one embodiment, each vertical step can have the height of a single pair of an insulating layer 32 and a sacrificial material layer 42. In another embodiment, multiple "columns" of staircases can be formed along a first horizontal direction such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang.

Figure 3:
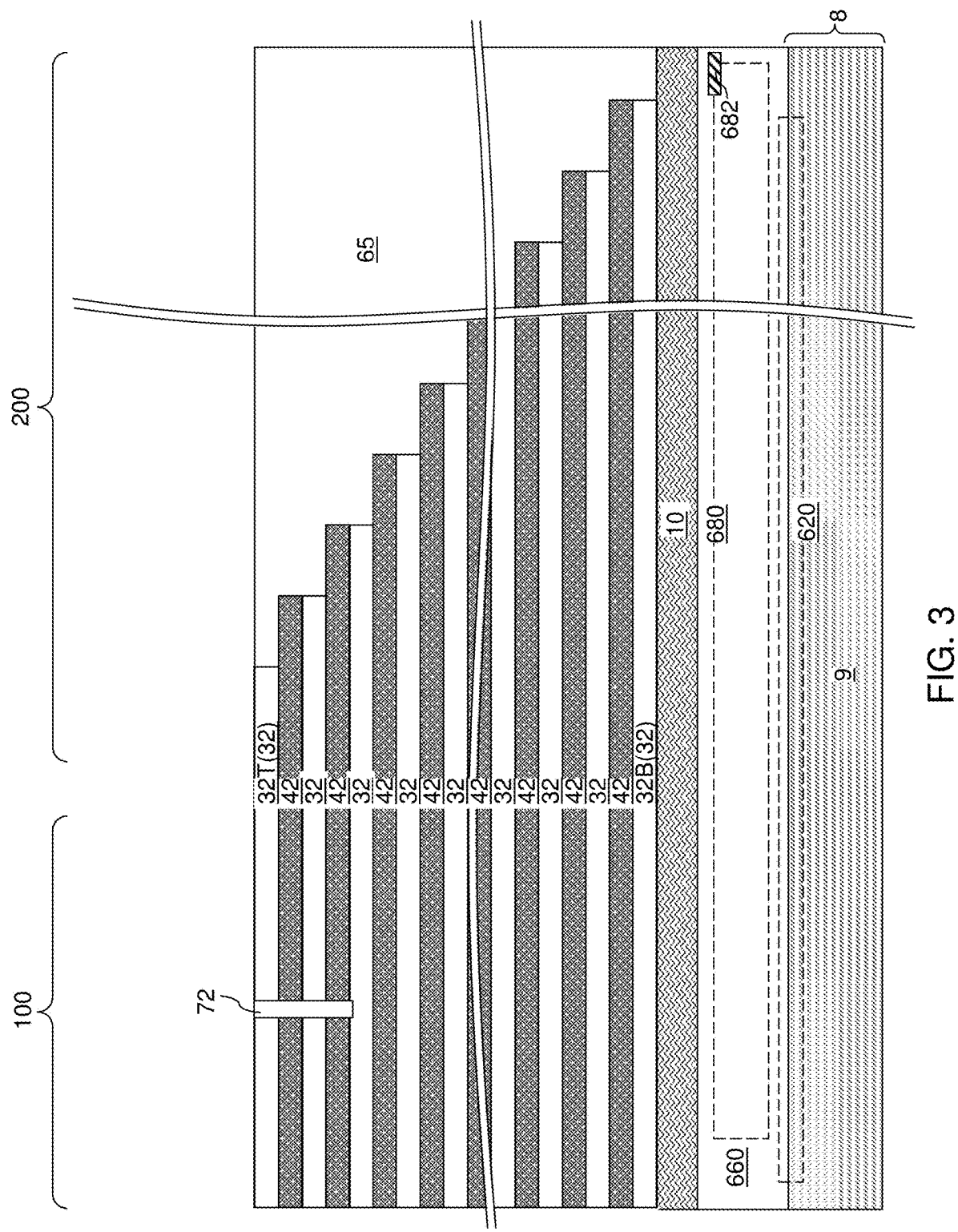
FIG. 3 is a schematic vertical cross-sectional view of the first exemplary structure after formation of a retro-stepped dielectric material portion according to the first embodiment of the present disclosure.
Figure 4A:
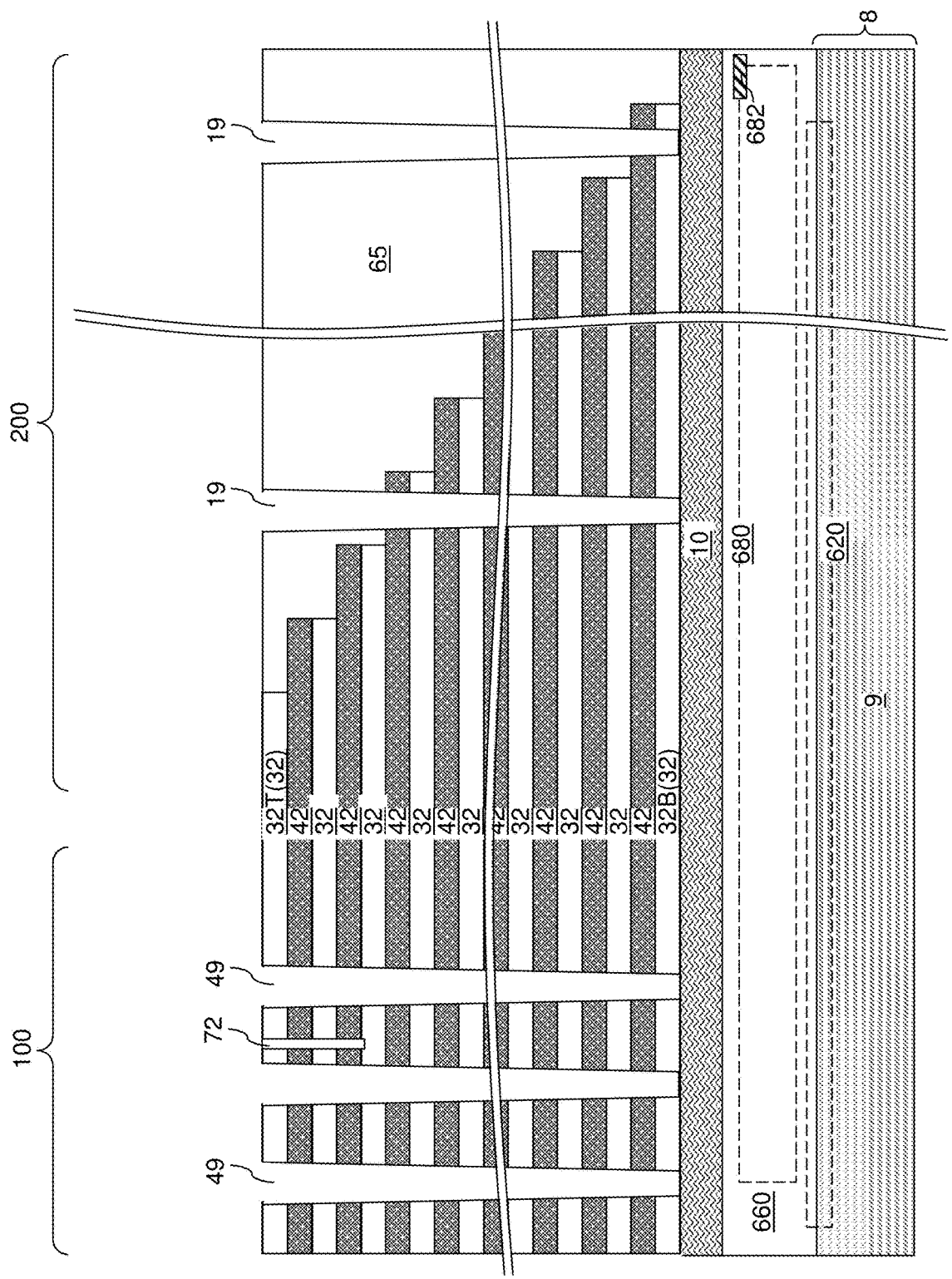
FIG. 4A is a schematic vertical cross-sectional view of the first exemplary structure after formation of memory openings and support openings according to the first embodiment of the present disclosure.
Figure 4B:
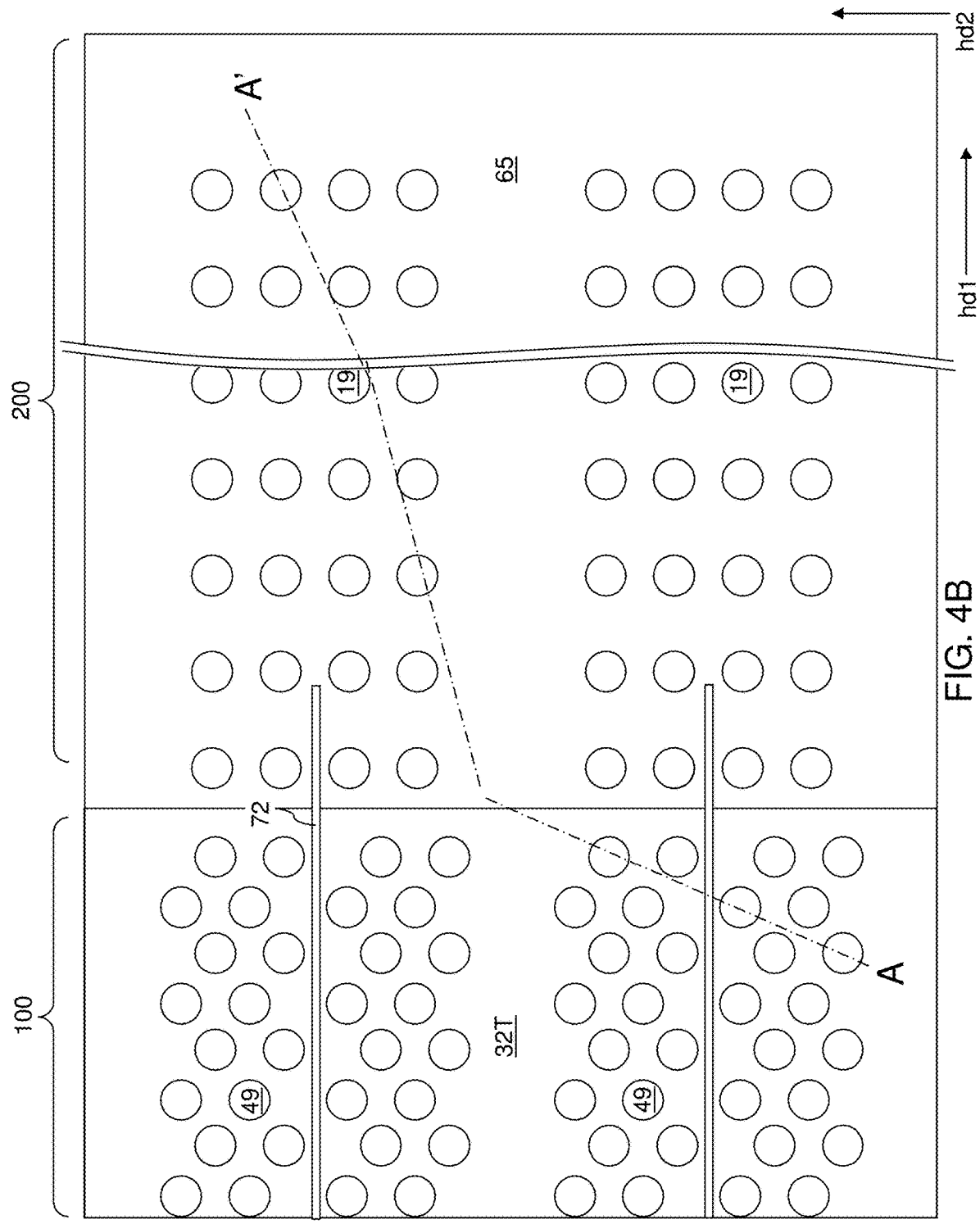
FIG. 4B is a top-down view of the first exemplary structure of FIG. 4A. The vertical plane A-A' is the plane of the cross-section for FIG. 4A.

Referring to FIG. 3, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 mayor may not, be doped with dopants such as B, P, and/or F.

Optionally, drain-select-level isolation structures 72 can be formed through the topmost insulating layer 32T and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32T.

Referring to FIGS. 4A, 4B, 5A and 6A, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the contact region 200. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 200.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

A two-dimensional array of memory openings 49 can be formed in the memory array region 100. A two-dimensional array of support openings 19 can be formed in the contact region 200. A plurality of rows of memory openings 49 can be formed such that each row of memory openings 49 is arranged along a first horizontal direction (e.g., word line direction) hd1. The plurality of rows of memory openings 49 may be laterally spaced apart along a second horizontal direction (e.g., bit line direction) hd2 that is perpendicular to the first horizontal direction hd1.

In one embodiment shown in FIG. 5A, the memory openings 49 and the support openings 19 may have a respective tapered vertical cross-sectional profile having a lateral dimension (e.g., diameter) that generally decreases with a vertical distance from a horizontal plane including a topmost surface of the topmost insulating layer 32T due to a general taper in the sidewalls of the memory openings 49 and the support openings 19. The average taper angle of the memory openings 49 and the support openings 49 may be in a range from 0.1 degree to 3 degrees, such as from 0.2 degree to 2 degrees, although lesser and greater taper angles may also be employed.

Figure 6C:
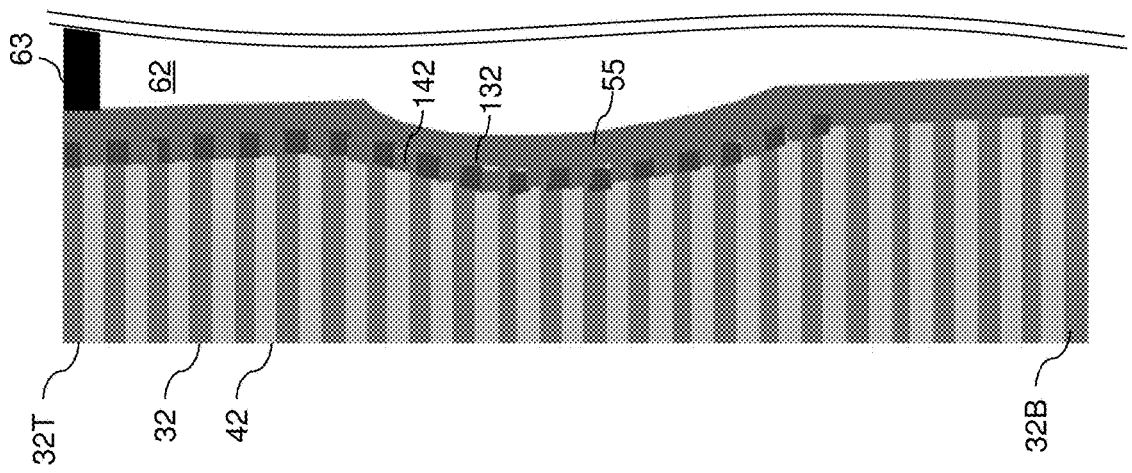
FIGS. 6A, 6B and 6C are sequential schematic vertical cross-sectional views of a memory opening within an alternative configuration of the first exemplary structure during formation of a memory opening fill structure in a bowed memory opening during the steps shown in FIGS. 5A, 5C and 5H, respectively, according to an alternative aspect of the first embodiment of the present disclosure.
Figure 6B:
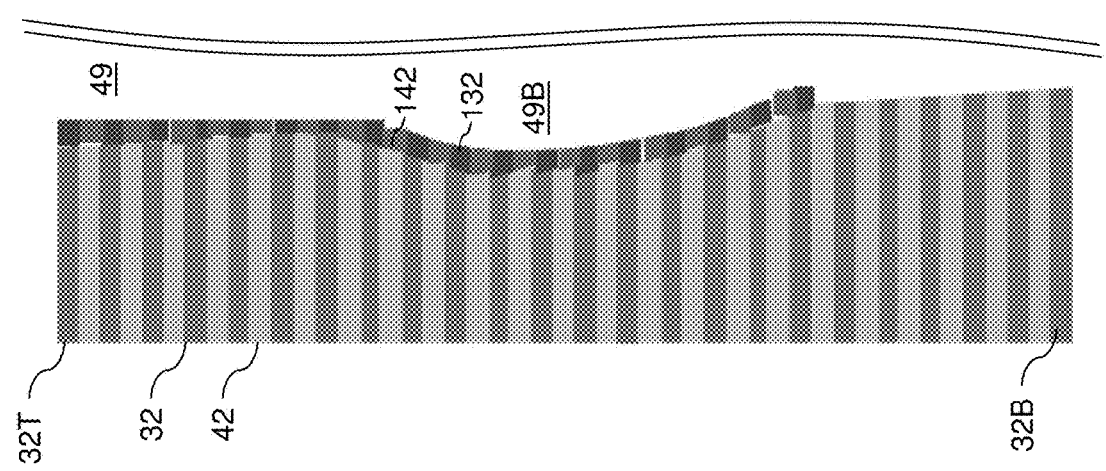
Figure 6A:
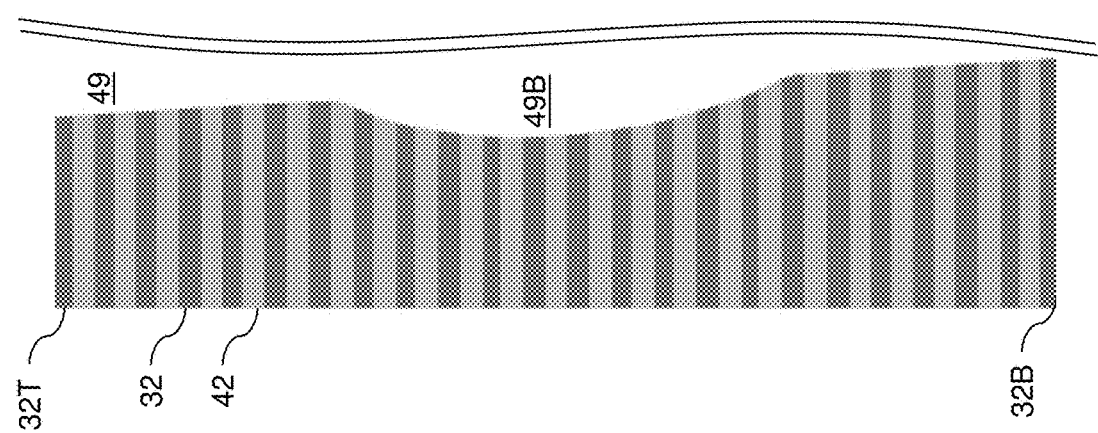

In another embodiment shown in FIG. 6A, the memory openings 49 and the support openings 19 may have a respective bowed vertical cross-sectional profile having a wider lateral dimension (e.g., diameter) in the middle than at the top and bottom. In one embodiment, the lateral dimension (such as a diameter) of each of the bowed memory openings 49 and the bowed support openings 19 generally decreases, then increases and then decreases with a vertical distance from a horizontal plane including a topmost surface of the topmost insulating layer 32T. A bulge region 49B is formed in the memory opening 49. The bulge region 49B has a wider diameter than upper and lower portions of the memory opening 49 located above and below the budge region 49B, respectively. Alternatively or additionally, the memory openings 49 and the support openings 19 may have combined bowed and tapered vertical cross-sectional profile, as shown in FIG. 6A.

In one embodiment, the physically exposed surfaces of the sacrificial material layers 42 may become rounded by corner chipping. Such corner chipping may occur for certain types of first sacrificial materials, such as silicon nitride materials. Specifically, portions of a silicon nitride material that are proximal to a silicon-oxide-based insulating material of the insulating layers 32 may be etched at a higher etch rate than middle portions of the silicon nitride material that are spaced from the insulating layers 32 during the anisotropic etch process that forms the memory openings 49 and the support openings 19. Generally, the longer the exposure to the etch chemistry of the anisotropic etch process, the greater the chipping of the silicon nitride material. The chipping or chamfering of the top and bottom portions of physically exposed surfaces of the sacrificial material layers 42 results in chamfered corners 42C of the sacrificial material layers 42 exposed in the memory openings 49 and the support openings 19, as shown in FIG. 5A. The chipping may be greater in proximity to the top portion of each memory opening 49 and each support opening 19 than in proximity to the bottom portion of each memory opening 49 and each support opening 19.

Referring to FIG. 5B, a first non-conformal, selective material deposition process can be performed. The first selective material deposition process grows a second sacrificial material from physically exposed surfaces of the sacrificial material layers 42 while suppressing growth of the second sacrificial material from physically exposed surfaces of the insulating layers 32. According to an aspect of the present disclosure, a first depletive area selective deposition process can be performed to grow the second sacrificial material from physically exposed surfaces of the sacrificial material layers 42 while suppressing growth of the second sacrificial material from physically exposed surfaces of the insulating layers 32. In an illustrative example, the first sacrificial material of the sacrificial material layers 42 may comprise a first silicon nitride material, and the second sacrificial material that is grown from the physically exposed surfaces of the sacrificial material layers 42 may comprise a second silicon nitride material. Deposited portions of the second sacrificial material in each memory opening 49 or in each support opening 19 form a vertical stack of sacrificial material spacers 142.

The first depletive area selective deposition process is performed in a reactant-depletive deposition mode, i.e., in a deposition mode in which the reactant is insufficient for conformal deposition due to consumption in areas that are more proximal to the reactant flow stream than in areas that are distal from the reactive flow stream. Specifically, the first exemplary structure can be placed in a deposition chamber for the first depletive area selective deposition process, and a reactant gas can be flowed into the process chamber. The reactant gas flows along the reactant flow stream above the top surface of the topmost insulating layers 32T, and the amount of the reactant gas that reaches the physically exposed surfaces of the sacrificial material layers 42 is limited by downward diffusion of the reactant gas toward the bottom portions of the memory openings 49 and the support openings 19. The flow rate of the reactant gas into the process chamber is set at a level that is insufficient to provide a temperature-limited conformal deposition of the second sacrificial material. In this case, a significant fraction of the reactant gas that enters the top portion of each memory opening 49 or each support opening 19 is consumed in proximity to the top portion of each memory opening 49 or each support opening 19, and only a small fraction of the reactant gas that enters the top portion of each memory opening 49 or each support opening 19 reaches the bottom portion of each memory opening 49 or each support opening 19. The deposition rate of the second sacrificial material is limited by the amount of the reactant gas that reaches the various physically exposed surfaces of the sacrificial material layers 42. Thus, deposition of the second sacrificial material on the physically exposed surfaces of the sacrificial material layers 42 occurs at different rates that varies as a function of a vertical distance from the top surface of the semiconductor material layer 10.

In one embodiment, the first selective material deposition process may comprise a depletive deposition process in which the thickness of the deposited second sacrificial material decreases with a downward vertical distance "dvd" from a horizontal plane HP including a topmost surface of the alternating stack (32, 42). In one embodiment, the vertical stack of sacrificial material portions 142 has a variable lateral thickness (as measured between an inner sidewall and an outer sidewall) that increases with a lateral distance from a vertical axis VA passing through a geometrical center GC of a volume of the memory opening 49. In one embodiment, the vertical stack of sacrificial material spacers 142 has a variable lateral thickness that increases with an upward vertical distance from the horizontal plane including the top surface of the semiconductor material layer 10, and decreases with a downward vertical distance dvd from the horizontal plane HP including the top surface of the topmost insulating layer 32T. The maximum of the lateral thickness of the sacrificial material spacers 142 may be in a range from 1 nm to 10 nm, such as from 2 nm to 5 nm, although lesser and greater thicknesses may also be employed.

In one embodiment, the first sacrificial material of the sacrificial material layers 42 comprises a first silicon nitride material (e.g. PECVD deposited silicon nitride), and the second sacrificial material of the sacrificial material spacers 142 comprises a second silicon nitride material (e.g., ALD deposited silicon nitride). In one embodiment, the depletive deposition process comprises a selective diffusion limited atomic layer deposition (ALD) process in which the saturated precursor coverage extends only to an upper portion of the memory openings 49 and provides sub-saturated precursor coverage in the lower portion of the memory openings 49. For example, as shown in FIG. 6B, the sacrificial material spacers 142 may be formed down to about the bottom of the bulge region 49B in the memory opening 49, and do not extend below the bottom of the bulge region 49B. In this example, the ALD process may comprise a silicon nitride ALD process in which the silicon precursor (e.g., dichlorosilane) cycle is provided for less than 2.5 seconds and the nitrogen precursor (e.g., ammonia) cycle is provided for less than 1 second. Purge steps of about 1 second are performed between the dichlorosilane and ammonia cycles. Other ALD silicon nitride precursors may also be used. Alternatively, the second sacrificial material of the sacrificial material spacers 142 comprises a second silicon nitride material that is deposited by chemical vapor deposition, such as plasma enhanced chemical vapor deposition or non-plasma chemical vapor deposition.

Figure 5D:
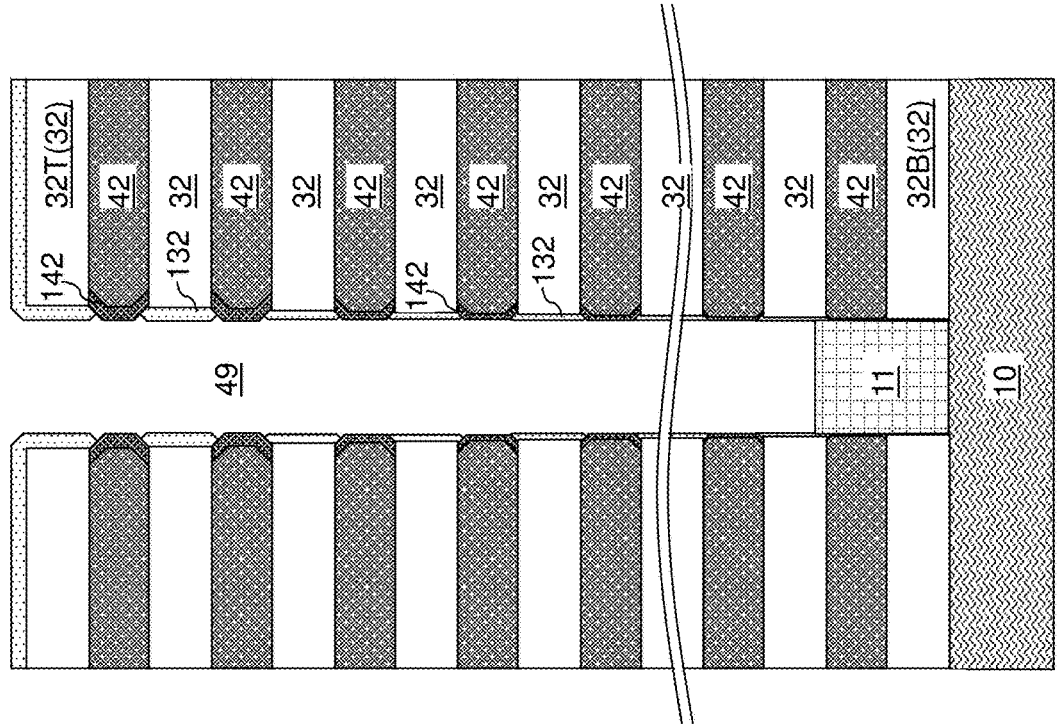
Figure 5C:
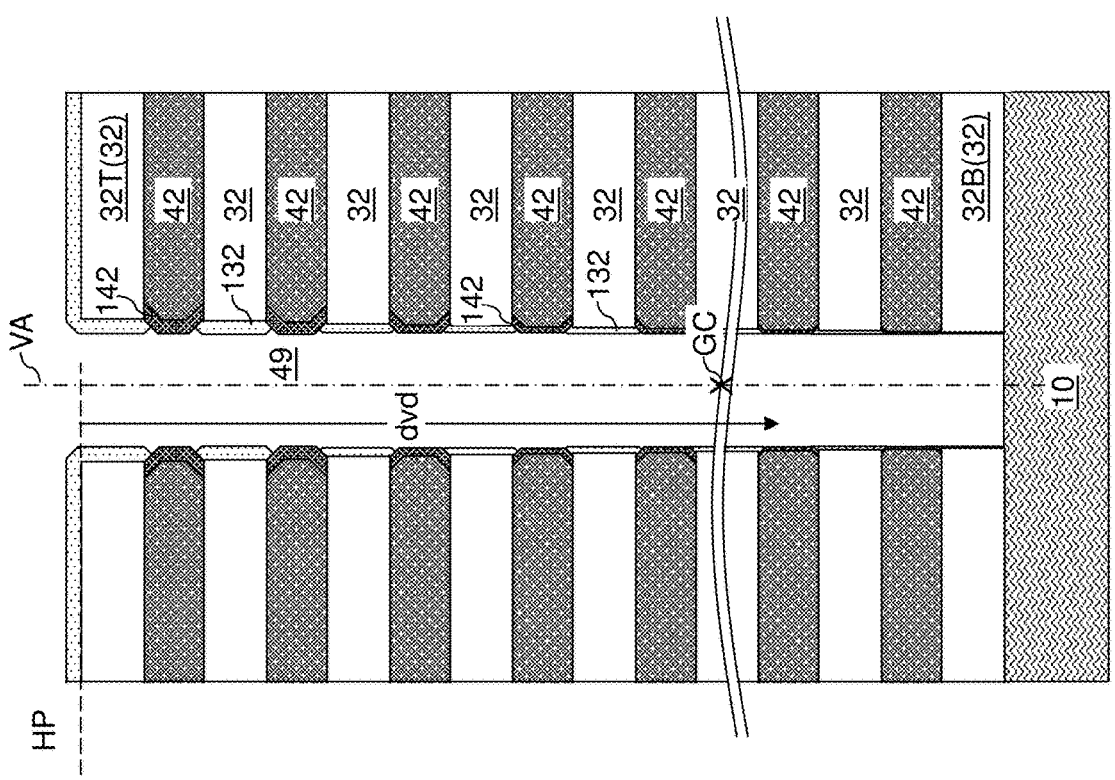

Referring to FIGS. 5C and 6B, a second selective material deposition process can be performed. The second selective material deposition process grows a second insulating material from physically exposed surfaces of the insulating layers 32 while suppressing growth of the second insulating material from physically exposed surfaces of the sacrificial material spacers 142. According to an aspect of the present disclosure, a second depletive area selective deposition process can be performed to grow the second insulating material from physically exposed surfaces of the insulating layers 32 while suppressing growth of the second insulating material from physically exposed surfaces of the sacrificial material spacers 142. In an illustrative example, the first insulating material of the insulating layers 32 may comprise a first silicon-oxide-based insulating material, and the second insulating material that is grown from the physically exposed surfaces of the insulating layers 32 may comprise a second silicon-oxide-based insulating material, such as silicon oxide. Deposited portions of the second insulating material in each memory opening 49 or in each support opening 19 form a vertical stack of insulating spacers 132.

The second depletive area selective deposition process is performed in a reactant-depletive deposition mode. Specifically, the first exemplary structure can be placed in a deposition chamber for the second depletive area selective deposition process, and a reactant gas can be flowed into the process chamber. The reactant gas flows along the reactant flow stream above the top surface of the topmost insulating layers 32T, and the amount of the reactant gas that reaches the physically exposed surfaces of the insulating layers 32 is limited by downward diffusion of the reactant gas toward the bottom portions of the memory openings 49 and the support openings 19. The flow rate of the reactant gas into the process chamber is set at a level that is insufficient to enable temperature-limited conformal deposition of the second insulating material. In this case, a significant fraction of the reactant gas that enters the top portion of each memory opening 49 or each support opening 19 is consumed in proximity to the top portion of each memory opening 49 or each support opening 19, and only a small fraction of the reactant gas that enters the top portion of each memory opening 49 or each support opening 19 reaches the bottom portion of each memory opening 49 or each support opening 19. The deposition rate of the second insulating material is limited by the amount of the reactant gas that reaches the various physically exposed surfaces of the insulating layers 32. Thus, deposition of the second insulating material on the physically exposed surfaces of the insulating layers 32 occurs at different rates that varies as a function of a vertical distance from the top surface of the semiconductor material layer 10.

In one embodiment, the second selective material deposition process may comprise a depletive deposition process in which the thickness of the deposited second insulating material decreases with a downward vertical distance dvd from a horizontal plane HP including a topmost surface of the alternating stack (32, 42). In one embodiment, the vertical stack of insulating spacers 132 has a variable lateral thickness (as measured between an inner sidewall and an outer sidewall) that increases with a lateral distance from a vertical axis VA passing through a geometrical center GC of a volume of the memory opening 49. In one embodiment, the vertical stack of insulating spacers 132 has a variable lateral thickness that increases with an upward vertical distance from the horizontal plane including the top surface of the semiconductor material layer 10, and decreases with a downward vertical distance dvd from the horizontal plane HP including the top surface of the topmost insulating layer 32T. The maximum of the lateral thickness of the insulating spacers 132 may be in a range from 1 nm to 10 nm, such as from 2 nm to 5 nm, although lesser and greater thicknesses may also be employed.

In one embodiment, the first insulating material comprises a first silicon oxide material (e.g., PECVD deposited silicon oxide), and the second insulating material comprises a second silicon oxide material (e.g., ALD deposited silicon oxide). In one embodiment, the depletive deposition process comprises a selective diffusion limited atomic layer deposition (ALD) process in which the saturated precursor coverage extends only to an upper portion of the memory openings 49 and provides sub-saturated precursor coverage in the lower portion of the memory openings 49. For example, as shown in FIG. 6B, the insulating spacers 132 may be formed down to about the bottom of the bulge region 49B in the memory opening 49, and do not extend below the bottom of the bulge region 48B. In this example, the ALD process may comprise a silicon oxide ALD process in which the silicon precursor (e.g., bis(diethylamino)silane (BDEAS)) cycle is provided for less than 3.5 seconds and the oxygen precursor (e.g., ozone) cycle is provided for less than 2 seconds. Purge steps of about 1 second are performed between the BDEAS and ozone cycles. Other ALD silicon oxide precursors may also be used. Alternatively, the second insulating material of the vertical stack of insulating spacers 132 comprises a second silicon oxide material that is deposited by chemical vapor deposition, such as plasma enhanced chemical vapor deposition or non-plasma chemical vapor deposition.

A vertical stack of insulating spacers 132 may be interlaced with a vertical stack of sacrificial material spacers 142 in each memory opening 49 and each support opening 19. According to an aspect of the present disclosure, the vertical stack reduces the width (e.g., diameter) of the memory openings 49 and the support openings 19. This increases the space between adjacent openings (e.g., between adjacent memory openings 49). The increase inter-opening space reduces or prevents formation of void in electrically conductive layers due to a pinch-off effect during replacement of the sacrificial material layers 42 with electrically conductive layers, as will be described below.

According to another aspect of the present disclosure, formation of the vertical stack of sacrificial material spacers 142 and the vertical stack of insulating spacers 132 in each memory opening 49 reduces the width differential of the memory openings 49 and the support openings 19. In other words, difference between the lateral dimension of the upper portion or the bulge portion 49B of the memory opening 49 or a support opening 19 and the lateral dimension of the lower portion of the memory opening 49 or the support opening 19 is reduced due to formation of the vertical stack of sacrificial material spacers 142 and the vertical stack of insulating spacers 132. Thus, formation of the vertical stack of sacrificial material spacers 142 and the vertical stack of insulating spacers 132 provides the benefit of enhanced uniformity of the lateral dimensions of the memory elements that are formed in the memory openings 49.

According to another aspect of the present disclosure, the vertical stack of sacrificial material spacers 142 covers the chamfered corners 42C of the sacrificial material layers 42 exposed in the memory openings 49. Thus, sacrificial material spacers 142 reduce or eliminate the defects that may be caused by the chipping and the chamfered corners 42C.

Referring to FIG. 5D, any portion of the second sacrificial material or the second insulating material that may be collaterally grown on the top surface of the semiconductor material layer 10 at the bottom of each of the memory openings 49 and the support openings 19 can be removed by performing an optional anisotropic etch process. An optional pedestal channel portion 11 (e.g., an epitaxial pedestal) can be formed at the bottom portion of each memory opening 49 and each support openings 19, for example, by selective epitaxy. Each pedestal channel portion 11 comprises a semiconductor material, such as silicon, which may have a doping of a first conductivity type which is the conductivity type of the semiconductor material in the semiconductor material layer 10. The pedestal channel portion 11 can be a portion of a transistor channel of a respective vertical field effect transistor to be subsequently formed in a respective memory opening 49. In case the semiconductor material layer 10 and the dielectric material layers 660 are omitted, the pedestal channel portions 11 can be formed on a top surface of the substrate material layer 9, which may be a semiconductor material layer.

Figure 5F:
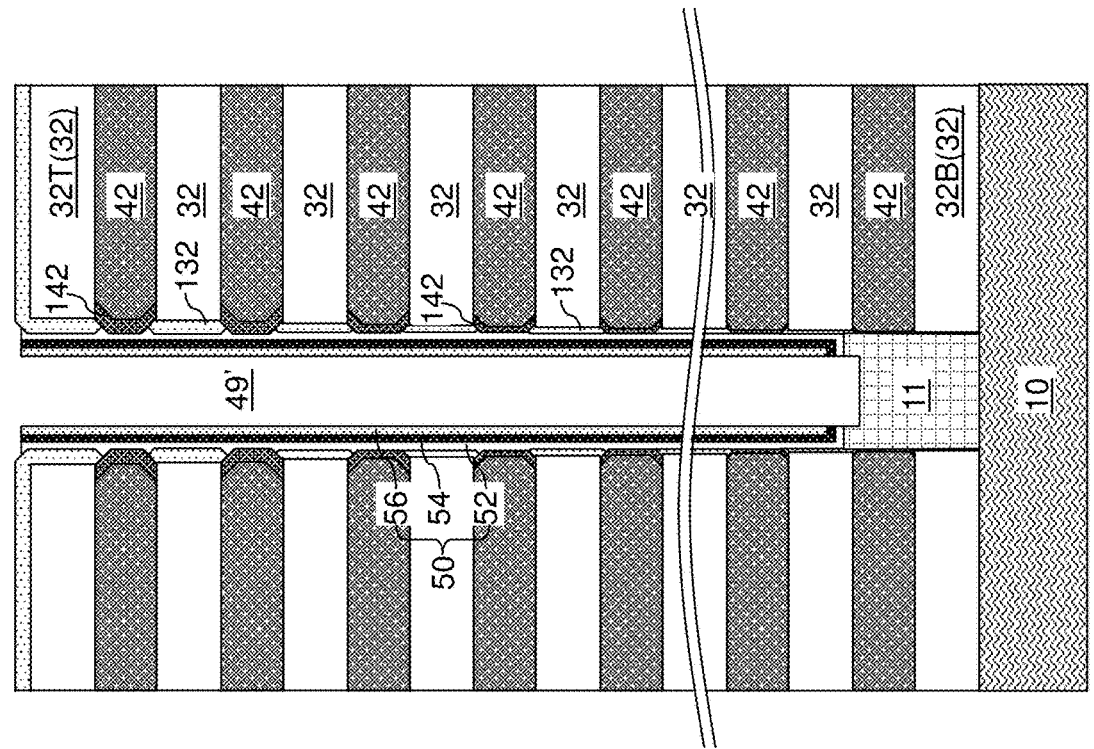
Figure 5E:
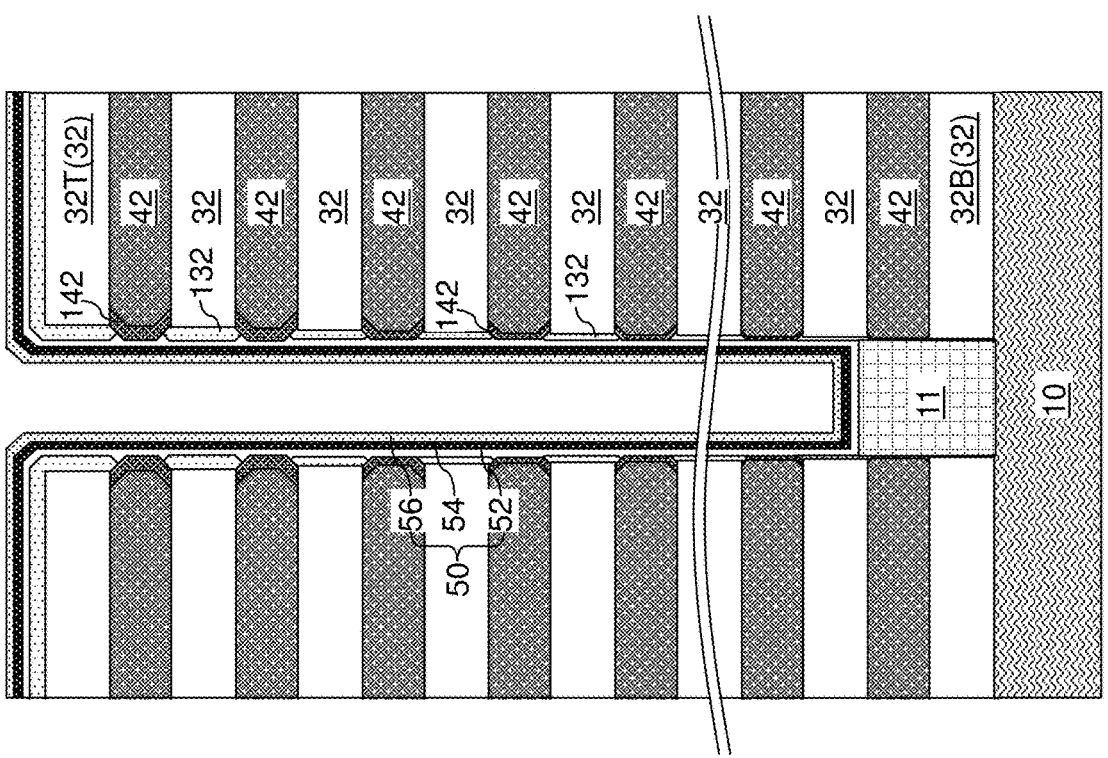

Referring to FIG. 5E, a stack of layers including a blocking dielectric layer 52, a memory material layer 54, and a dielectric liner 56 can be deposited on the physically exposed surfaces of a vertical stack of insulating spacers 132 and a vertical stack of sacrificial material spacers 142 in each memory opening 49. The stack of layers is herein referred to as a memory film 50.

The blocking dielectric layer 52 can include a single dielectric material layer or a stack of a plurality of dielectric material layers. In one embodiment, the blocking dielectric layer 52 can include a dielectric metal oxide layer consisting essentially of a dielectric metal oxide. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include patterned discrete floating gates of a conductive material such as doped polysilicon or a metallic material, for example, by being formed within lateral recesses into sacrificial material layers 42. In one embodiment, the memory material layer 54 includes a silicon nitride layer. In one embodiment, the memory material layer 54 can be formed as a single continuous layer. Generally, the memory material layer 54 may comprise a vertical stack of memory elements that are located at levels of the sacrificial material layers 42. For example, the vertical stack of memory elements may comprise annular portions of the memory material layer 54 located at levels of the sacrificial material layers 42.

The optional dielectric liner 56, if present, comprises a dielectric liner material. In one embodiment, the dielectric liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed. Optionally, a sacrificial cover layer (not shown) may be formed over the memory film 50.

Referring to FIG. 5F, the optional sacrificial cover material layer (not shown), the dielectric liner 56, the memory material layer 54, the blocking dielectric layer 52 are sequentially anisotropically etched employing at least one anisotropic etch process. The portions of the sacrificial cover material layer, the dielectric liner 56, the memory material layer 54, and the blocking dielectric layer 52 located above the top surface of the topmost insulating layer 32T can be removed by the at least one anisotropic etch process. Further, the horizontal portions of the sacrificial cover material layer, the dielectric liner 56, the memory material layer 54, and the blocking dielectric layer 52 at a bottom of each memory cavity 49' can be removed to form openings in remaining portions thereof. Each of the sacrificial cover material layer, the dielectric liner 56, the memory material layer 54, and the blocking dielectric layer 52 can be etched by a respective anisotropic etch process employing a respective etch chemistry, which may or may not be the same for the various material layers.

Each remaining portion of the sacrificial cover material layer can have a tubular configuration. A surface of the pedestal channel portion 11 (or a surface of the semiconductor material layer 10 in case the pedestal channel portions 11 are not employed) can be physically exposed underneath the opening through the sacrificial cover material layer, the dielectric liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. In one embodiment, the sacrificial cover material layer, the dielectric liner 56, the memory material layer 54, and the blocking dielectric layer 52 can have vertically coincident sidewalls. The sacrificial cover material layer can be subsequently removed selective to the material of the dielectric liner 56. In case the sacrificial cover material layer includes amorphous silicon, a wet etch process employing hot trimethyl-2 hydroxyethyl ammonium hydroxide ("hot TMY") or tetramethyl ammonium hydroxide (TMAH) can be performed to remove the sacrificial cover material layer. Alternatively, the sacrificial cover material layer may be retained in the final device if it comprises a semiconductor material, such as amorphous silicon or polysilicon.

Figure 5H:
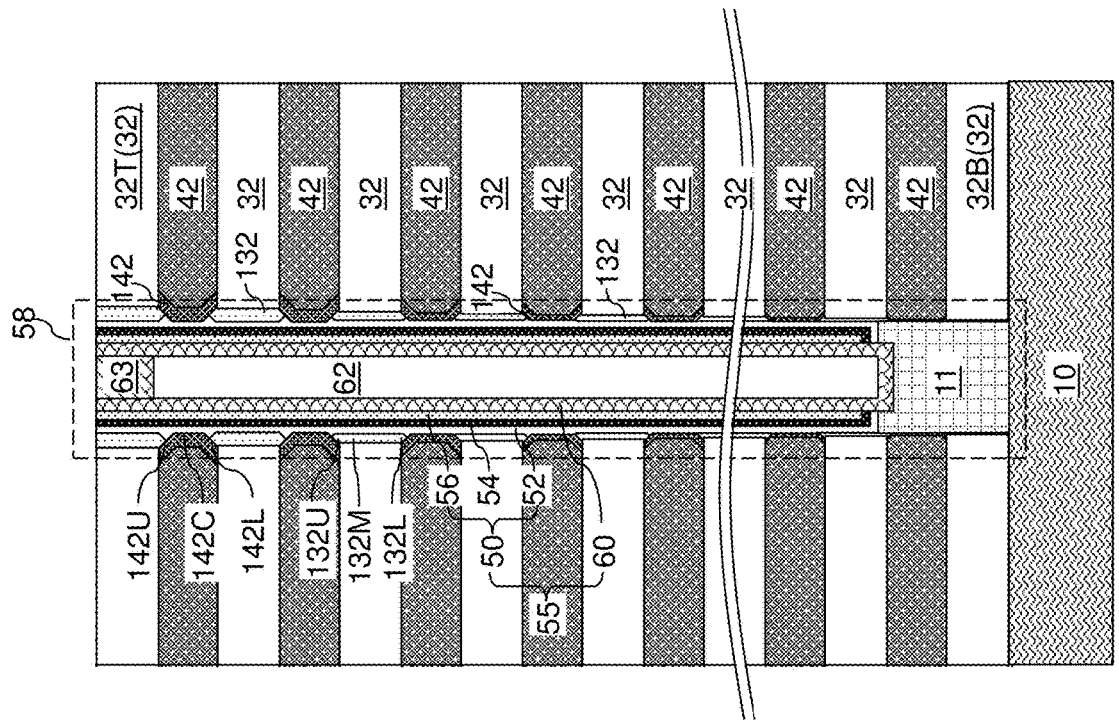
Figure 5G:
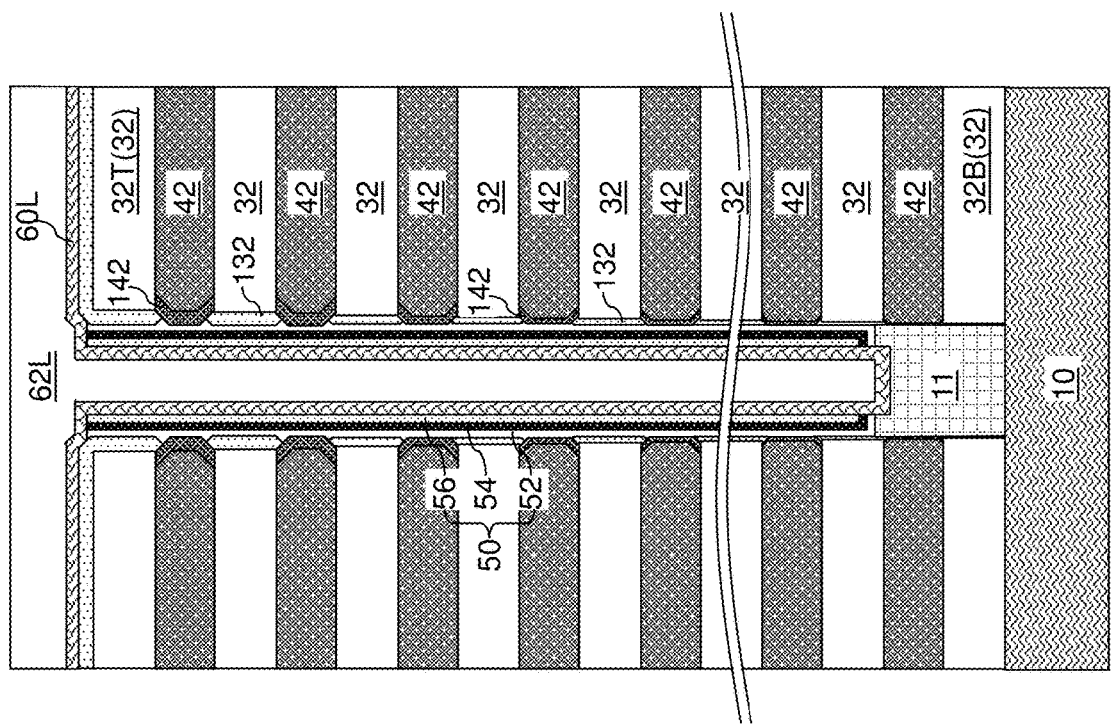

Referring to FIG. 5G, a semiconductor channel layer 60L can be deposited directly on the semiconductor surface of the pedestal channel portion 11 or the semiconductor material layer 10 if the pedestal channel portion 11 is omitted, and directly on the dielectric liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

A dielectric core layer 62L can be deposited to fill any remaining portion of the memory cavity 49' within each memory opening 49. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5I:
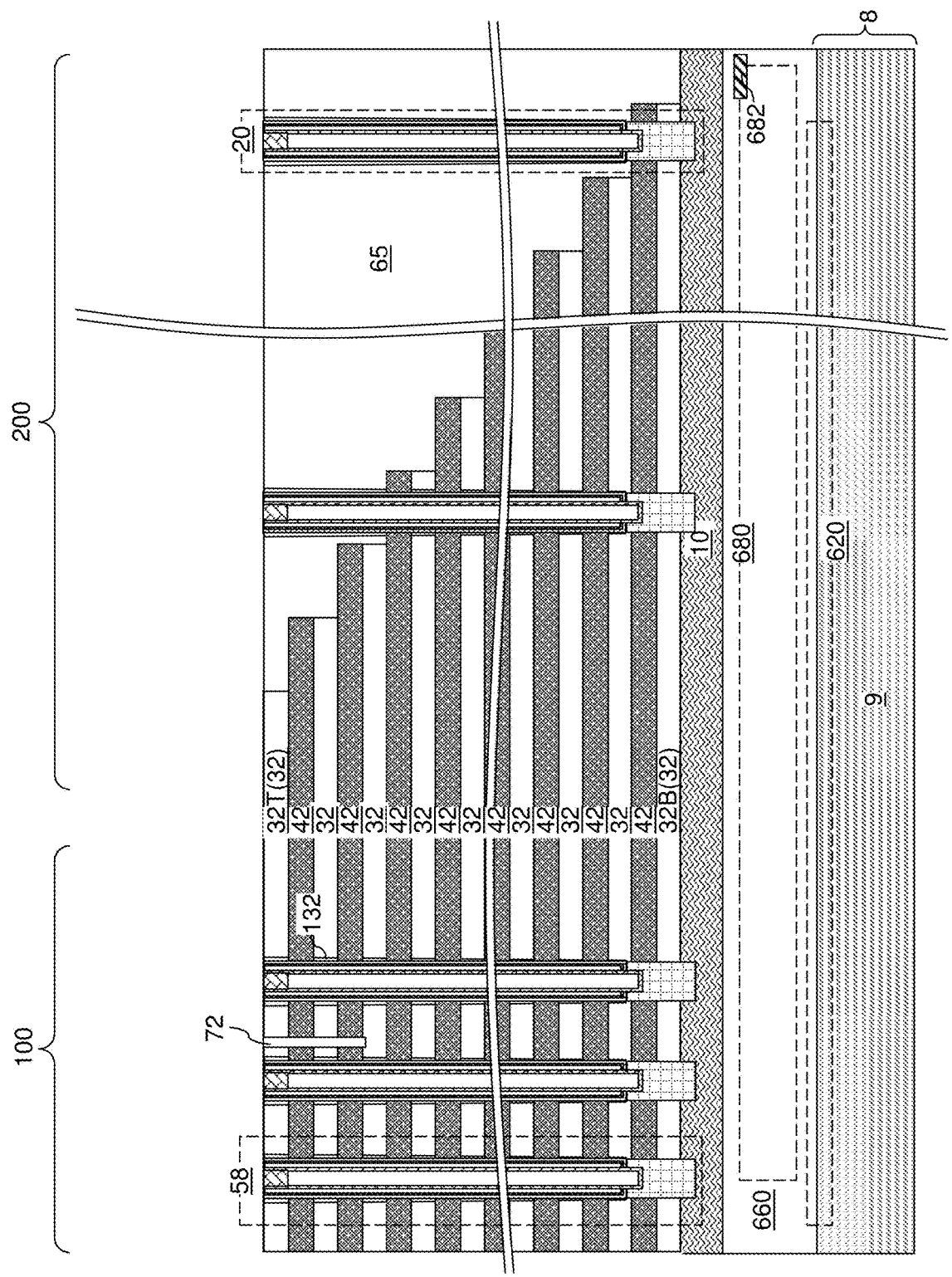
FIG. 5I is a schematic vertical cross-sectional view of the first exemplary structure after formation of memory stack structures and support pillar structures according to the first embodiment of the present disclosure.

Referring to FIGS. 5H, 5I and 6C the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the topmost insulating layer 32T. Each remaining portion of the dielectric core layer 62L constitutes a dielectric core 62.

A doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type, the semiconductor channel layer 60L, and the topmost insulating spacers 132 can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each combination of a memory film 50 and a vertical semiconductor channel 60 within a memory opening 49 constitutes a memory stack structure 55. The memory stack structure 55 is a combination of a semiconductor channel, a dielectric liner 56, a plurality of memory elements as embodied as portions of the memory material layer 54, and an optional blocking dielectric layer 52. The set of all material portions that fills a memory opening 49 is herein referred to as a memory opening fill structure 58. In one embodiment, each memory opening fill structure 58 may comprise a vertical stack of insulating spacers 132, a vertical stack of sacrificial material spacers 142, an optional pedestal channel portion 11, a memory stack structure 55, a dielectric core 62, and a drain region 63. The set of all material portions that fills a support opening 19 is herein referred to as a support pillar structure 20. In one embodiment, one or more of the support pillar structures 20 may comprise a vertical stack of insulating spacers 132, a vertical stack of sacrificial material spacers 142, an optional pedestal channel portion 11, a memory stack structure 55, a dielectric core 62, and a drain region 63. The number of sacrificial material spacers 142 in a support pillar structure 20 may be less than the number of sacrificial material spacers 142 in a memory opening fill structure 58. The number of insulating spacers 132 in a support pillar structure 20 may be less than the number of insulating spacers 132 in a support pillar structure 20.

In one embodiment shown in FIG. 5H, a plurality of the sacrificial material spacers 142 in each memory opening 49 may comprise a respective cylindrical surface 142C, a respective upper tapered annular surface 142U adjoined to an upper periphery of the respective cylindrical surface 142C, and a respective lower tapered annular surface 142L adjoined to a lower periphery of the respective cylindrical surface 142C. In one embodiment, the upper tapered annular surfaces 142U may have different vertical extents that increase in magnitude with a vertical distance from a top surface of the substrate 8. In one embodiment, the cylindrical surfaces 142C of the plurality of sacrificial material portions 142 may have different vertical extents that decrease in magnitude with a vertical distance from a top surface of the substrate 8. In one embodiment, each of the sacrificial material layers 42 may have a same thickness. In this case, the sacrificial material layers 42 may have a same vertical extent between a respective horizontal top surface and a respective horizontal bottom surface.

In one embodiment, each memory opening fill structure 58 may comprise a vertical stack of insulating spacers 132 that are vertically spaced apart from each other and contacting a respective one of the insulating layers 32. In one embodiment, lateral thicknesses of the insulating spacers 132 of the vertical stack of insulating spacers 132 decreases with a vertical distance from a top surface of the substrate 8. In one embodiment, the insulating layers 32 comprise a first silicon-oxide-based insulating material, and the vertical stack of insulating spacers 132 comprises a second silicon-oxide-based insulating material.

In one embodiment, at least one insulating spacer 132 of a vertical stack of insulating spacers 132 has a middle portion 132M having an inner sidewall and an outer sidewall that are parallel to each other, an upper portion 132U having upper tapered surfaces that are adjoined to each other at an annular top periphery, and a lower portion 132U having lower tapered surfaces that are adjoined to each other at an annular bottom periphery. In one embodiment, each memory opening fill structure 58 comprises a layer stack of a blocking dielectric layer 52, a memory material layer 54, and a dielectric liner 56, and the vertical stack of memory elements comprises portions of the memory material layer 54. An outer sidewall of the memory material layer 54 may have a lesser taper angle relative to a vertical direction than a taper angle of surface segments of the memory opening fill structure 58 that contact a respective one of the insulating layers 32 relative to the vertical direction. The difference between the taper angles is due to the depletive nature of the deposition process that forms each vertical stack of insulating spacers 132.

In one embodiment, the blocking dielectric layer 52 in each memory opening fill structure 58 may comprise a vertical stack of annular rib portions at levels of an upper subset of the sacrificial material layers 42 that include the topmost sacrificial material layer 42. Two annular rib portions are provided per each sacrificial material layer 42 within the upper subset of the sacrificial material layers 42.

Referring to FIG. 5I, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory opening fill structure 58 comprises a respective memory stack structure 55. Each memory stack structure 55 includes a vertical semiconductor channel 60 and a memory film 50. The memory film 50 may comprise a dielectric liner 56 laterally surrounding the vertical semiconductor channel 60 and a vertical stack of memory elements (which may comprise portions of a memory material layer 54) laterally surrounding the dielectric liner 56 (if present in combination with the charge storage regions) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
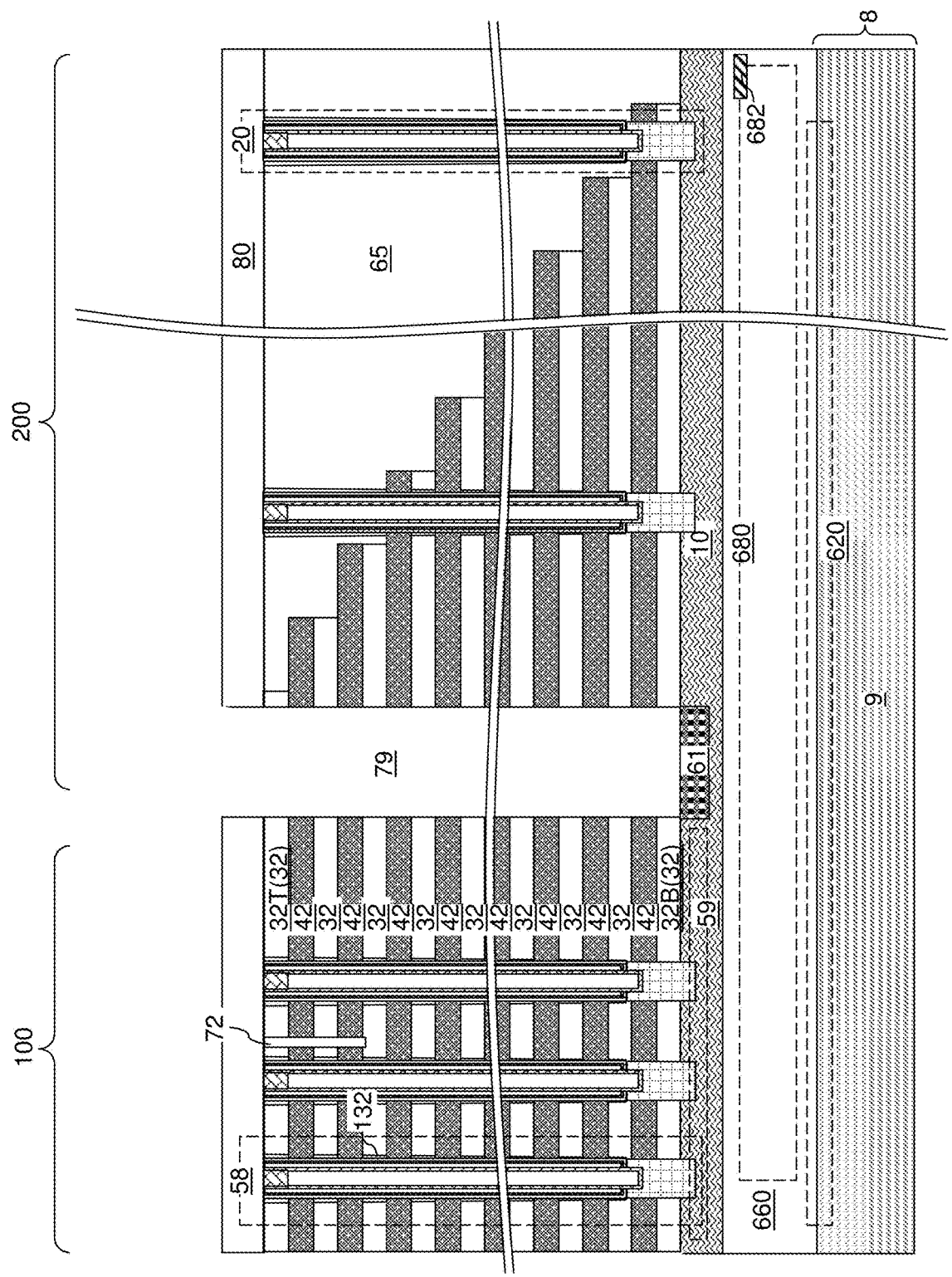
FIG. 7A is a schematic vertical cross-sectional view of the first exemplary structure after formation of backside trenches and source regions according to the first embodiment of the present disclosure.
Figure 7B:
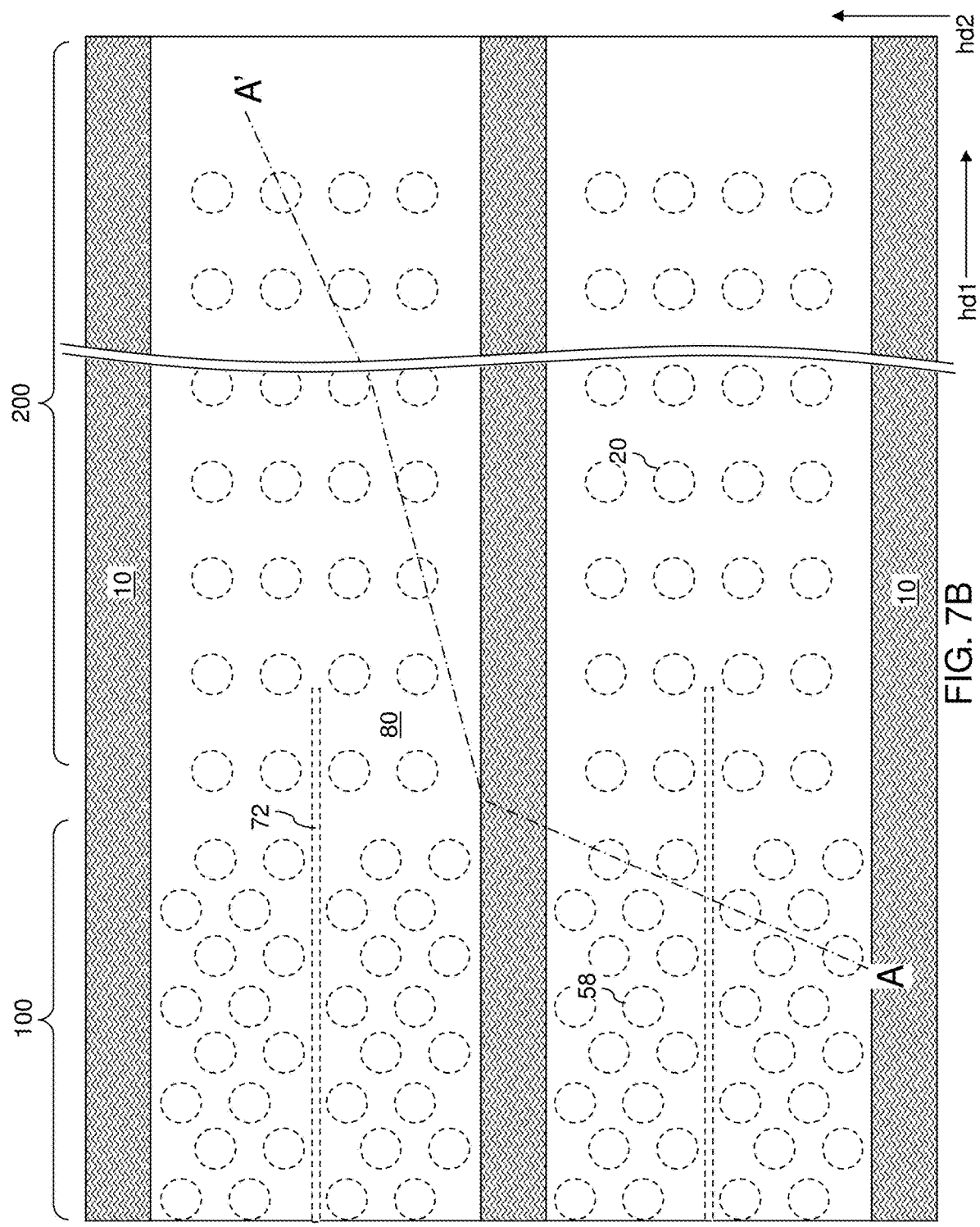
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact-level dielectric layer 80 can be formed over the alternating stack (32, 42) of insulating layer 32 and sacrificial material layers 42, and over the memory stack structures 55 and the support pillar structures 20. The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be employed.

A photoresist layer (not shown) can be applied over the contact-level dielectric layer 80, and is lithographically patterned to form openings in areas between clusters of memory stack structures 55. The pattern in the photoresist layer can be transferred through the contact-level dielectric layer 80, the alternating stack (32, 42) and/or the retro-stepped dielectric material portion 65 employing an anisotropic etch to form backside trenches 79, which vertically extend from the top surface of the contact-level dielectric layer 80 at least to the top surface of the semiconductor material layer 10, and laterally extend through the memory array region 100 and the contact region 200.

In one embodiment, the backside trenches 79 can laterally extend along the first horizontal direction hd1 (which may be a word line direction), and can be laterally spaced apart from each other along the second horizontal direction hd2 (which can be a bit line direction) that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 80 and the alternating stack (32, 42). The alternating stack (32, 42) as formed at the processing steps of FIG. 2 is divided into multiple alternating stacks (32, 42) that are laterally spaced apart along the second horizontal direction hd2 by the backside trenches 79.

Dopants of the second conductivity type can be implanted into physically exposed surface portions of the semiconductor material layer 10 (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the semiconductor material layer 10 that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the vertical semiconductor channels 60 in the memory opening fill structures 58 constitutes a horizontal semiconductor channel 59 for a plurality of field effect transistors. The horizontal semiconductor channel 59 is connected to multiple vertical semiconductor channels 60.

Figure 8A:
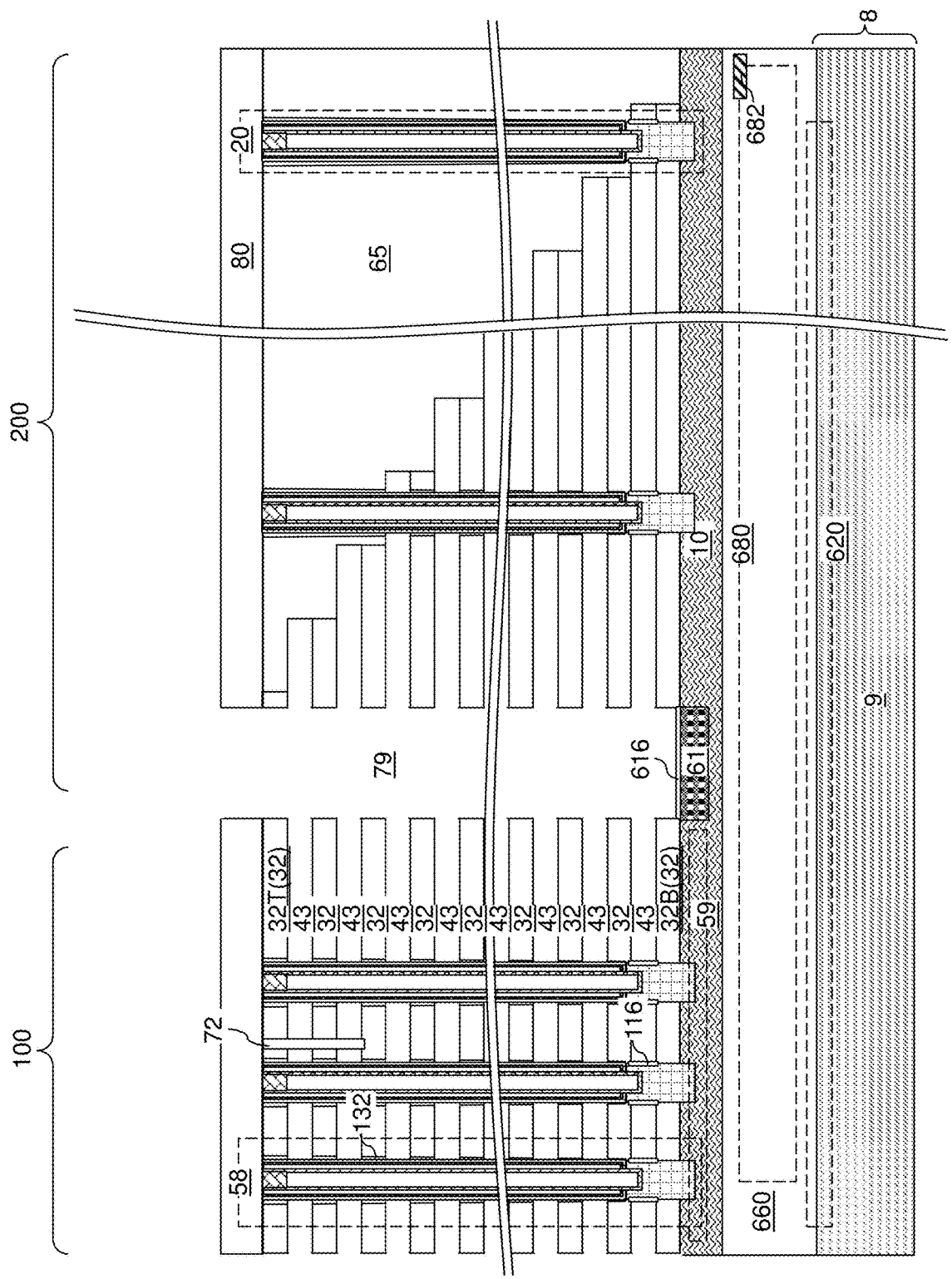
FIG. 8A is a schematic vertical cross-sectional view of the first exemplary structure after formation of backside recesses according to the first embodiment of the present disclosure.
Figure 8B:
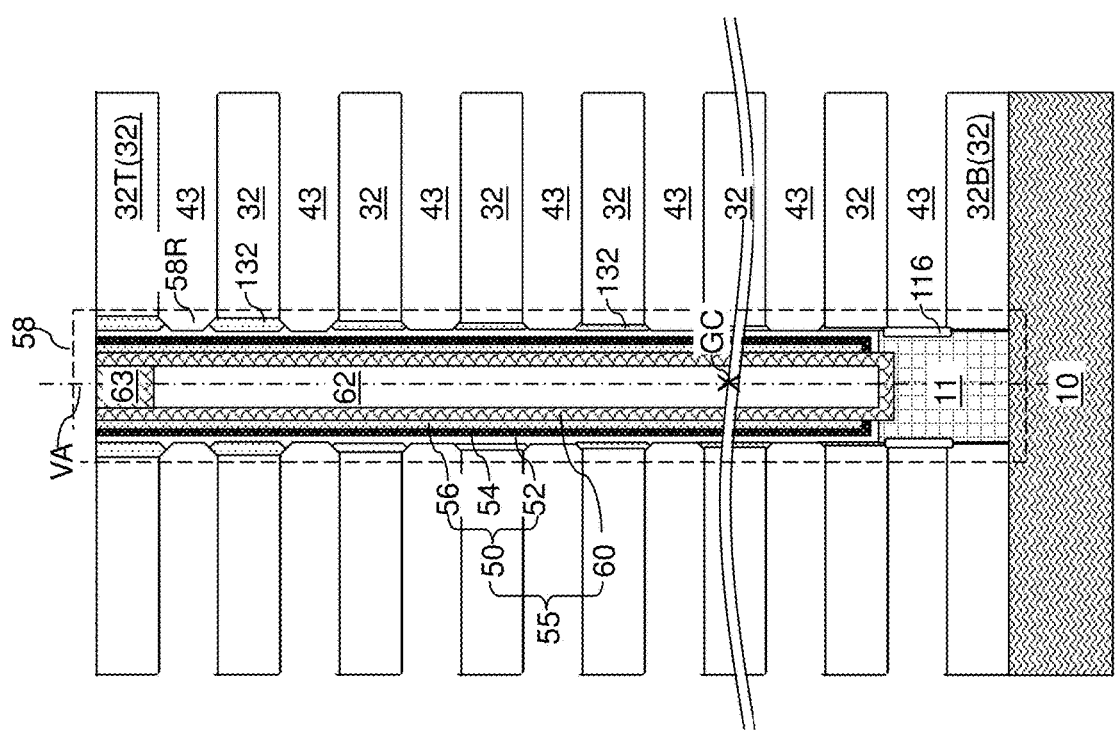
FIG. 8B is a magnified view of a region around a memory opening fill structure of the first exemplary structure of FIG. 8A.

Referring to FIGS. 8A and 8B, an etchant that selectively etches the first sacrificial material of the sacrificial material layers 42 and the second sacrificial material of the sacrificial material spacers 142 with respect to the first insulating material of the insulating layers 32 and the second insulating material of the insulating spacers 132 and with respect to the material of the blocking dielectric layers 52 can be introduced into the backside trenches 79, for example, employing an etch process. Backside recesses 43 are formed in volumes from which the sacrificial material layers 42 and the sacrificial material spacers 142 are removed. In one embodiment, the sacrificial material layers 42 can include a first silicon nitride material, the sacrificial material portions 142 can include a second silicon nitride material, the insulating layers 32 can include a first silicon-oxide-based material, the insulating spacers 132 can include a second silicon-oxide-based material, and the retro-stepped dielectric material portion 65 can include a third silicon-oxide-based material.

The etch process that removes the sacrificial material layers 42 and the sacrificial material spacers 142 selective to the insulating layers 32, the insulating spacers 132, and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 and the sacrificial material spacers 142 include silicon nitride materials, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the first sacrificial material of the sacrificial material layers 42 is removed. The memory openings in which the memory stack structures 55 are formed are herein referred to as front side openings or front side cavities in contrast with the backside recesses 43.

Each of the plurality of backside recesses 43 can extend substantially parallel to the top surface of the semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout. In one embodiment shown in FIG. 8B, the memory opening fill structure 58 comprises a vertical stack of annular lateral recesses 58R at levels of the backside recesses 43 formed by removal of the sacrificial material spacers 142.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9A:
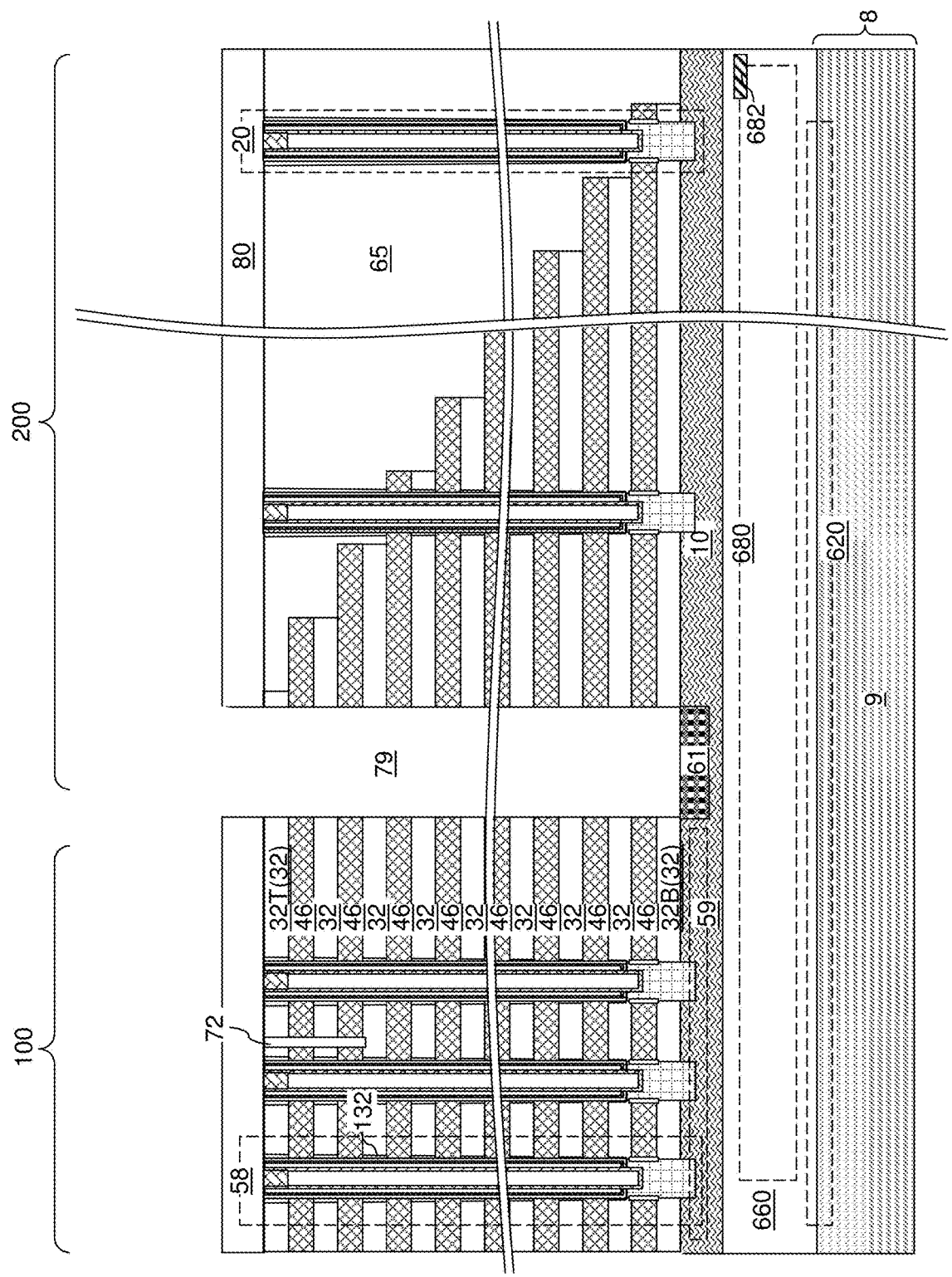
FIG. 9A is a schematic vertical cross-sectional view of the first exemplary structure after formation of electrically conductive layers according to the first embodiment of the present disclosure.
Figure 9B:
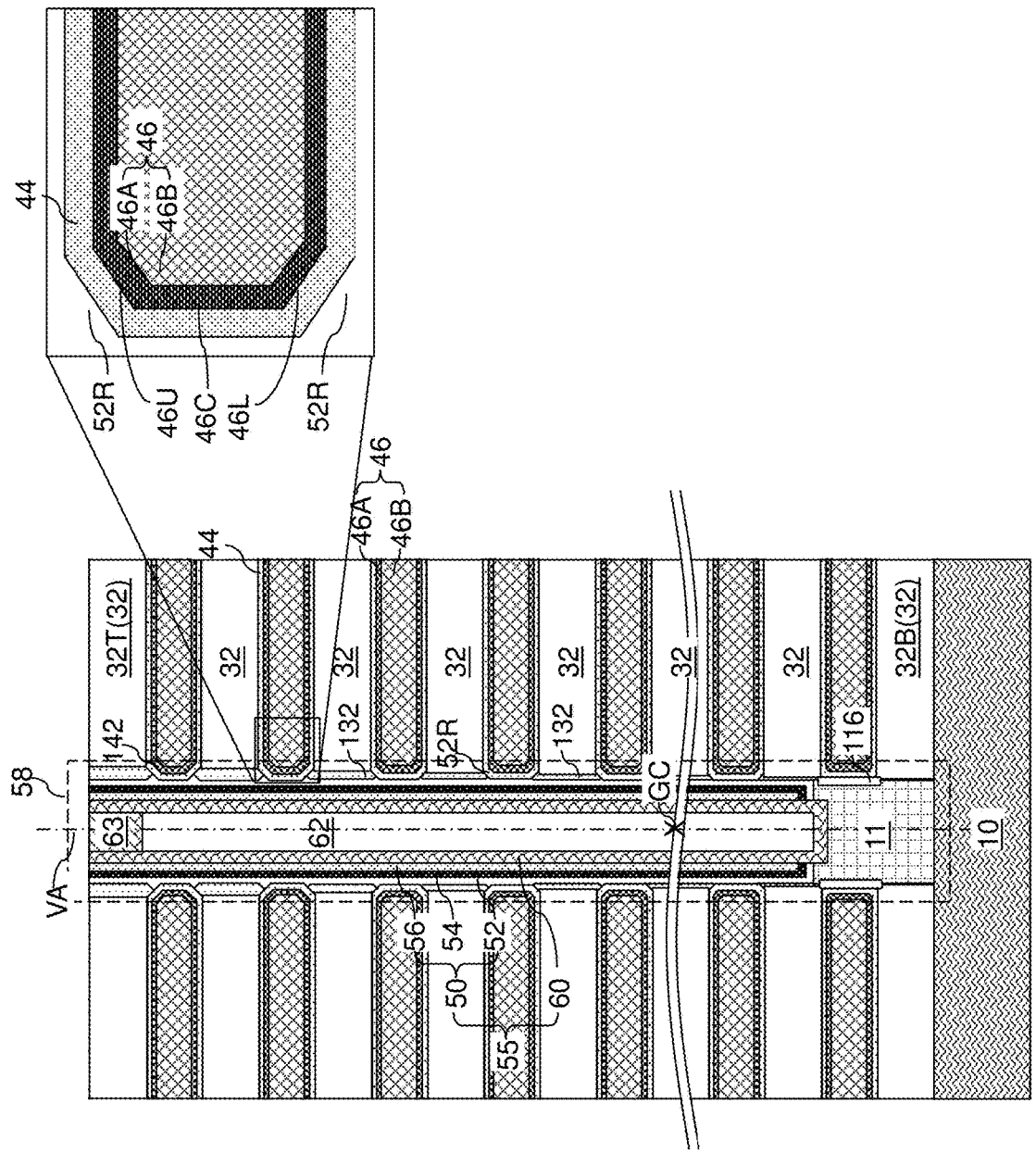

Referring to FIGS. 9A, 9B and 9C, a backside blocking dielectric layer 44 can be optionally formed. The structure in FIG. 9B includes a tapered memory opening 49 while the structure in FIG. 9C includes a bowed and tapered memory opening 49. The backside blocking dielectric layer 44, if present, comprises a dielectric material that functions as a control gate dielectric for the control gates to be subsequently formed in the backside recesses 43. The backside blocking dielectric layer 44 can be performed conformally along the contour of the physically exposed surfaces of the insulating layers 32, the insulating spacers 132, and the blocking dielectric layers 54.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, and the portions of the sidewall surfaces of the memory stack structures 55 that are physically exposed to the backside recesses 43. A backside cavity is present within the portion of each backside trench 79 that is not filled with the backside blocking dielectric layer 44.

At least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 80 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact-level dielectric layer 80. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the contact-level dielectric layer 80.

According to one aspect of the present disclosure, the electrically conductive layers 46 do not include voids therein. The reduction or elimination of the voids results from the increased inter-memory opening spacing due to the presence of the spacers (132, 142). The increased inter-memory opening spacing permits the metal precursor (e.g., tungsten hexafluoride) to flow freely in the backside recesses 43 between the memory opening fill structures 58 having a greater inter-structure spacing. This reduces or eliminates pinch-off points between the adjacent structures 58, at which the metal may form a pinch-point wall that encloses a void that has not yet been filled with the metal.

The deposited metallic material of the continuous electrically conductive material layer is etched back from the sidewalls of each backside trench 79 and from above the contact-level dielectric layer 80 by performing an etch back process that etches the at least one conductive material of the continuous electrically conductive material layer. The planar dielectric portions 616 can be collaterally removed during the etch back process. The etch back process may comprise an isotropic etch process and/or an anisotropic etch process. Each remaining portion of the deposited metallic material in the backside recesses 43 constitutes an electrically conductive layer 46. Each electrically conductive layer 46 can be a conductive line structure (e.g., a word line or a select gate line). Thus, the sacrificial material layers 42 are replaced with the electrically conductive layers 46.

Each electrically conductive layer 46 other then the select gate electrodes located at the top and bottom of the alternating stack can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Generally, the combination of the vertical stacks of sacrificial material spacers 142 and the sacrificial material layers 42 can be replaced with the electrically conductive layers 46. Thus, an alternating stack (32, 46) of insulating layers 32 and electrically conductive layers 46 can be formed over a substrate 8. A memory opening 49 vertically extends through the alternating stack (32, 46). A memory opening fill structure 58 can be located in the memory opening 49. The memory opening fill structure 58 comprises a vertical stack of memory elements and a vertical semiconductor channel 60. Each electrically conductive layer 46 within a subset of the electrically conductive layers 46 including a topmost electrically conductive layer 46 comprises a respective cylindrical surface 46C that laterally surrounds the memory opening fill structure 58, an upper tapered annular surface 46U adjoined to an upper periphery of the respective cylindrical surface 46C, and a lower tapered annular surface 46U adjoined to a lower periphery of the respective cylindrical surface 46C, as shown in FIG. 9B.

In one embodiment, the upper tapered annular surfaces 46U within the subset of the electrically conductive layers 46 have different vertical extents that increase in magnitude with a vertical distance from a top surface of the substrate 8. In one embodiment, the cylindrical surfaces 46C within the subset of the electrically conductive layers 46 have different vertical extents that decrease in magnitude with a vertical distance from a top surface of the substrate 8. In one embodiment, each electrically conductive layer 46 within the subset of the electrically conductive layers 46 have a same vertical extent between a respective horizontal top surface and a respective horizontal bottom surface. In other words, the electrically conductive layers 46 may have the same thickness, and the fraction of the vertical extent of the cylindrical surfaces 46C of the electrically conductive layers 46 relative to the thickness of each electrically conductive layer 46 can decrease with a vertical distance from the horizontal plane including the top surface of the substrate 8 (or from the horizontal plane including the top surface of the semiconductor material layer 10). The fraction of the vertical extent of the upper tapered annular surfaces 46U of the electrically conductive layers 46 relative to the thickness of each electrically conductive layer 46 can increase with a vertical distance from the horizontal plane including the top surface of the substrate 8 (or from the horizontal plane including the top surface of the semiconductor material layer 10). The fraction of the vertical extent of the lower tapered annular surfaces 46L of the electrically conductive layers 46 relative to the thickness of each electrically conductive layer 46 can increase with a vertical distance from the horizontal plane including the top surface of the substrate 8 (or from the horizontal plane including the top surface of the semiconductor material layer 10).

In one embodiment shown in FIG. 8B, the memory opening fill structure 58 comprises a vertical stack of annular lateral recesses 58R at levels of the backside recesses 43. As shown in FIG. 9B, each electrically conductive layer 46 within a subset of the electrically conductive layers 46 protrudes inward (i.e., toward a vertical axis VA passing through a geometrical center GC of the memory opening fill structure 58) into a respective annular lateral recess of the annular lateral recesses 58R described above.

In one embodiment, the memory opening fill structure 58 comprises a vertical stack of insulating spacers 132 that are vertically spaced apart from each other and contacting a respective one of the insulating layers 32. In one embodiment, lateral thicknesses of the insulating spacers 132 among the vertical stack of insulating spacers 132 increases with a vertical distance from a top surface of the substrate 8. In one embodiment, the insulating layers 32 comprise a first silicon-oxide-based insulating material, and the vertical stack of insulating spacers 132 comprises a second silicon-oxide-based insulating material that is different in composition from the first silicon-oxide-based insulating material. In one embodiment, at least one insulating spacer 132 has a middle portion 132M having an inner sidewall and an outer sidewall that are parallel to each other, an upper portion 132U having upper tapered surfaces that are adjoined to each other at an annular top periphery, and a lower portion 132L having lower tapered surfaces that are adjoined to each other at an annular bottom periphery, as described above with respect to FIG. 5H. Such an insulating spacer 132 may have a vertical cross-sectional shape of a vertically-elongated hexagon.

In one embodiment, one, a plurality and/or each of the electrically conductive layers 46 may comprise a horizontal top surface having a first periphery that is adjoined to a top periphery of the upper tapered annular surface 46U of the electrically conductive layer 46, and a horizontal bottom surface having a second periphery that is adjoined to a bottom periphery of the lower tapered annular surface 46L of the electrically conductive layer 46, as described above with respect to FIG. 5H.

In one embodiment, the memory opening fill structure 58 comprises a layer stack of a blocking dielectric layer 52, a memory material layer 54, and a dielectric liner 56; the vertical stack of memory elements comprises portions of the memory material layer 54; and an outer sidewall of the memory material layer 54 has a lesser taper angle relative to a vertical direction than a taper angle of surface segments of the memory opening fill structure 58 that contact a respective one of the insulating layers 32 relative to the vertical direction.

In one embodiment shown in FIG. 9B, the blocking dielectric layer 52 comprises a vertical stack of annular rib portions 52R at levels of the subset of the electrically conductive layers 46; and two annular rib portions 52R are provided per each electrically conductive layer 46 within the subset of the electrically conductive layers 46.

Figure 10A:
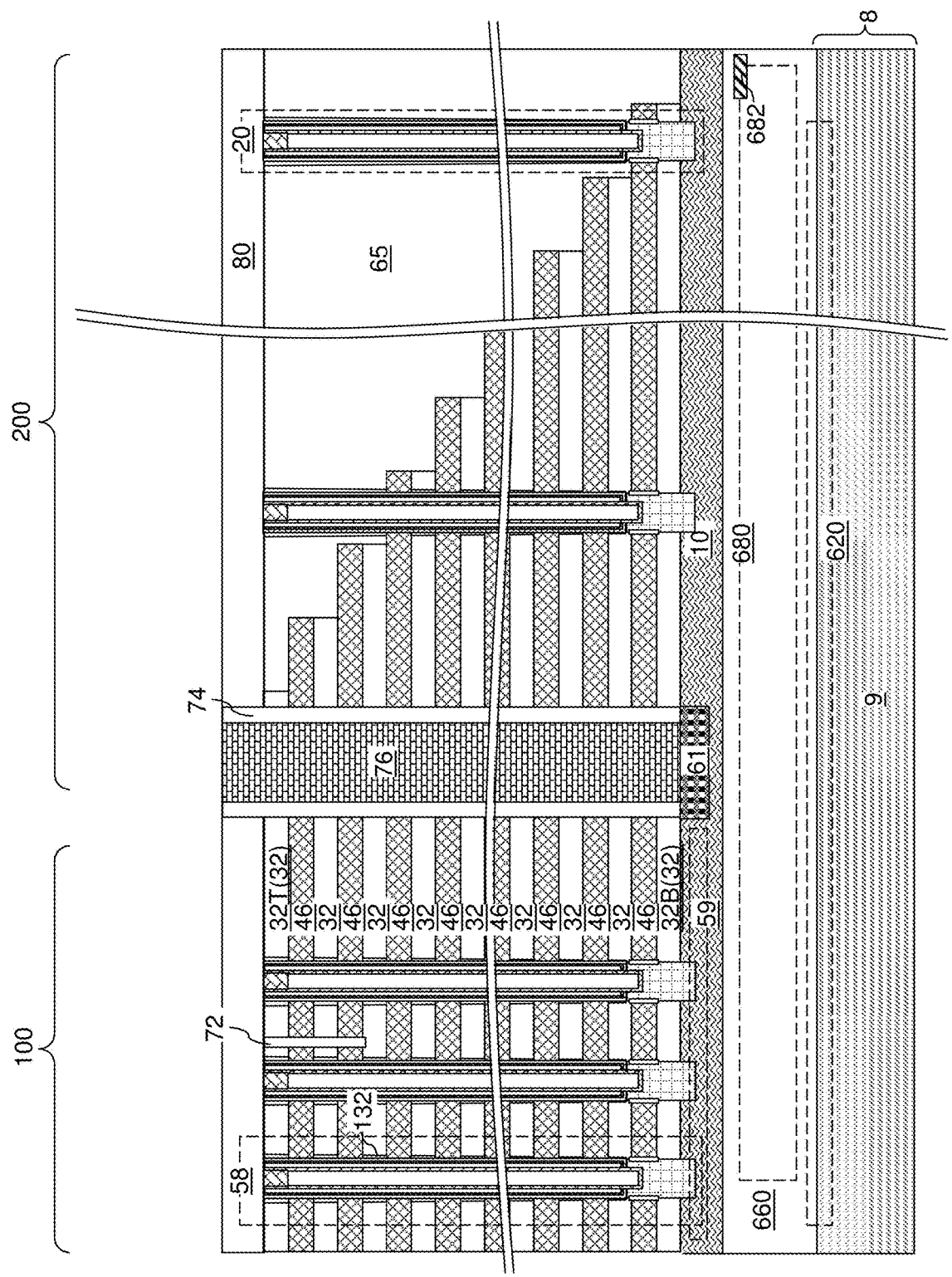
FIG. 10A is a schematic vertical cross-sectional view of the first exemplary structure after formation of backside trench fill structures according to the first embodiment of the present disclosure.
Figure 10B:
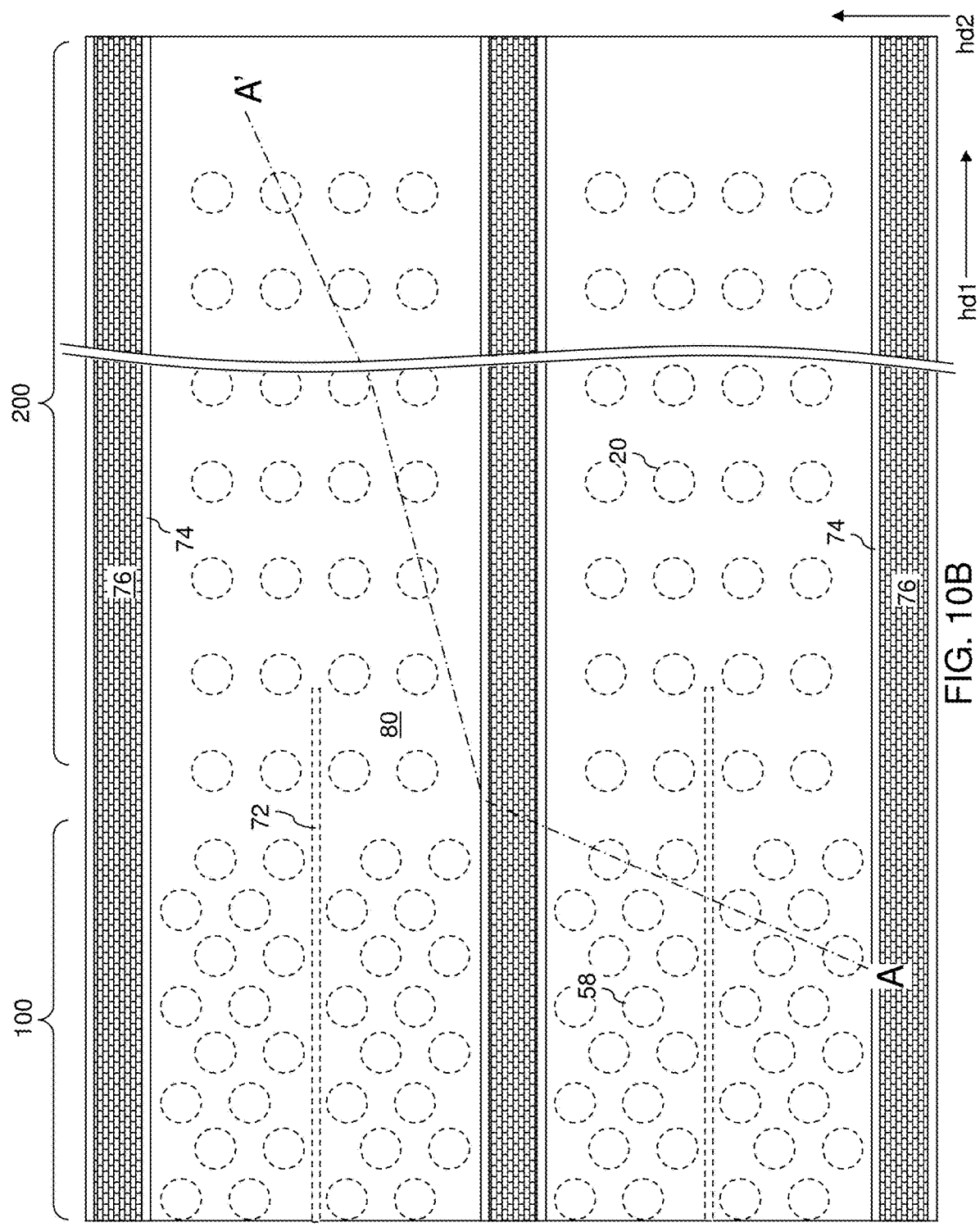
FIG. 10B is a partial see-through top-down view of the first exemplary structure of FIG. 10A. The vertical plane A-A' is the plane of the schematic vertical cross-sectional view of FIG. 10A.

Referring to FIGS. 10A and 10B, an insulating material layer can be formed in the backside trenches 79 and over the contact-level dielectric layer 80 by a conformal deposition process. An anisotropic etch process can be performed to remove horizontally-extending portions of the insulating material layer. Each vertically-extending portion of the insulating material layer constitutes an insulating spacer 74.

At least one conductive material, such as at least one metallic material, can be deposited in the backside cavities that are laterally surrounded by a respective one of the insulating spacers 74. Excess portions of the at least one conductive material can be removed from above the horizontal plane including the top surface of the contact-level dielectric layer 80. Each remaining portion of the at least one conductive material filling a respective backside cavity constitutes a backside contact via structure 76. Each backside contact via structure 76 can contact a top surface of a respective source region 61.

Figure 11A:
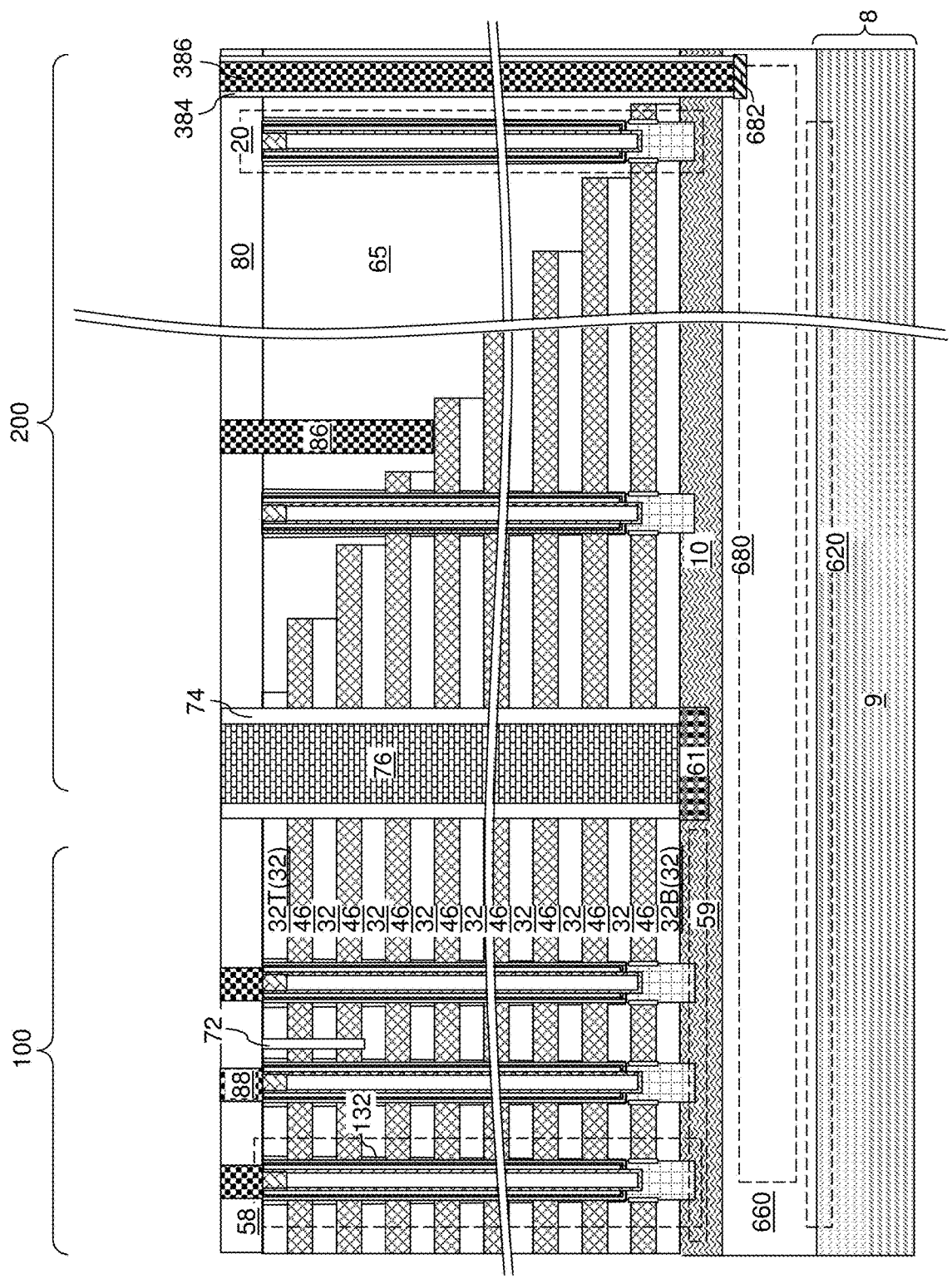
FIG. 11A is a schematic vertical cross-sectional view of the first exemplary structure after formation of contact via structures according to the first embodiment of the present disclosure.
Figure 11B:
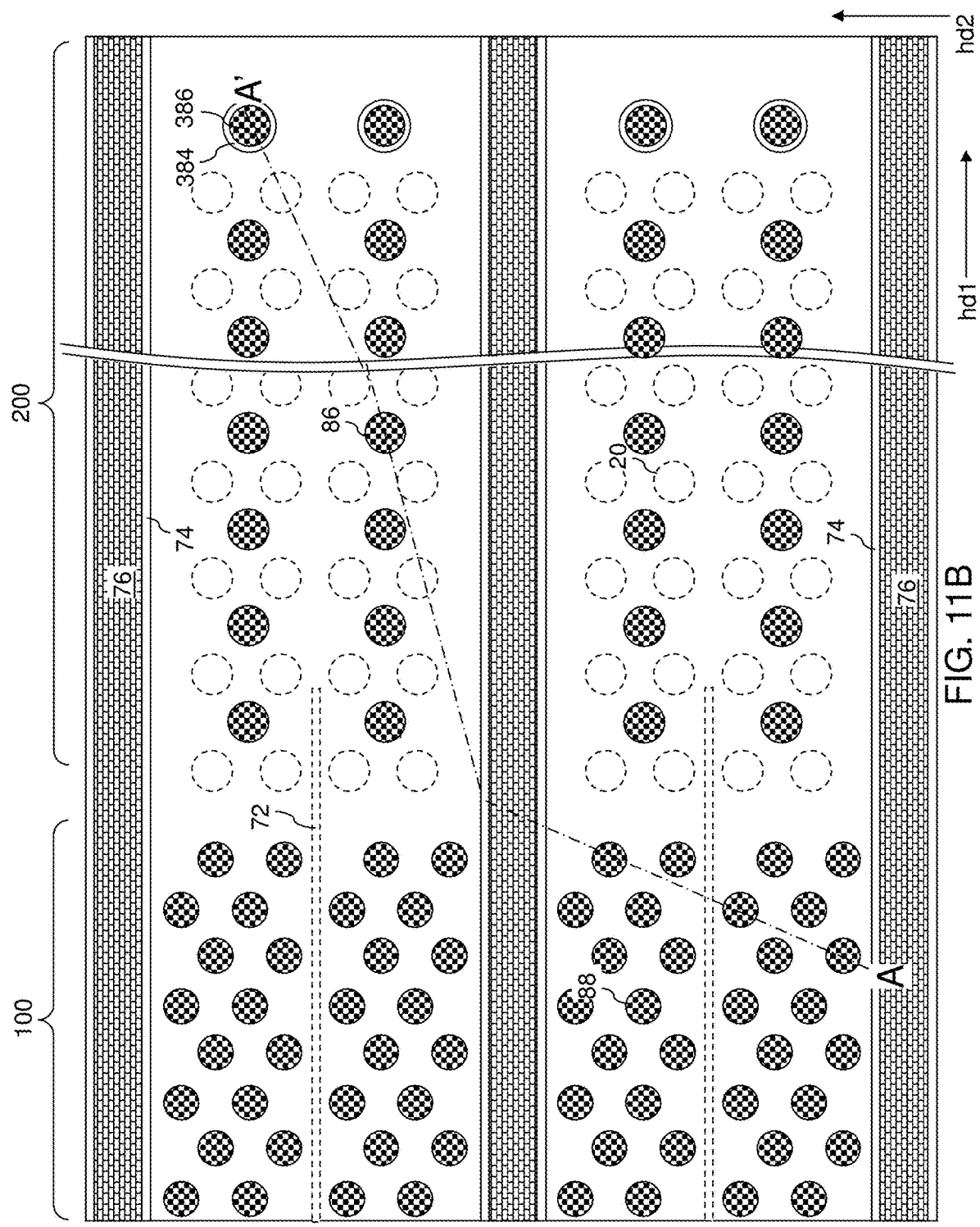
FIG. 11B is a partial see-through top-down view of the first exemplary structure of FIG. 11A. The vertical plane A-A' is the plane of the schematic vertical cross-sectional view of FIG. 11A.

Referring to FIGS. 11A and 11B, additional contact via structures (88, 86, 386) can be formed through the contact-level dielectric layer 80, and optionally through the retro-stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the retro-stepped dielectric material portion 65. Through-memory-level connection via structures 386 can be formed through the retro-stepped dielectric material portion 65 and through the semiconductor material layer 10 directly on a respective metal pad 682. An insulating spacer 384 may be formed around each through-memory-level connection via structure 386 to electrically isolate the through-memory-level connection via structures 386 from the semiconductor material layer 10.

FIGS. 12A-12H are sequential schematic vertical cross-sectional views of a memory opening 49 within a second exemplary structure during formation of a memory opening fill structure 58 according to a second embodiment of the present disclosure. In the second embodiment, the insulating spacers 132 are formed prior to the sacrificial material spacers 142, Referring to FIG. 12A, a memory opening 49 in the second exemplary structure is illustrated at a processing step that corresponds to the processing steps of FIGS. 4A, 4B, and 5A. The second exemplary structure at the processing steps of FIG. 12A can be the same as the first exemplary structure at the processing steps of FIGS. 4A, 4B, and 5A.

Figure 12B:
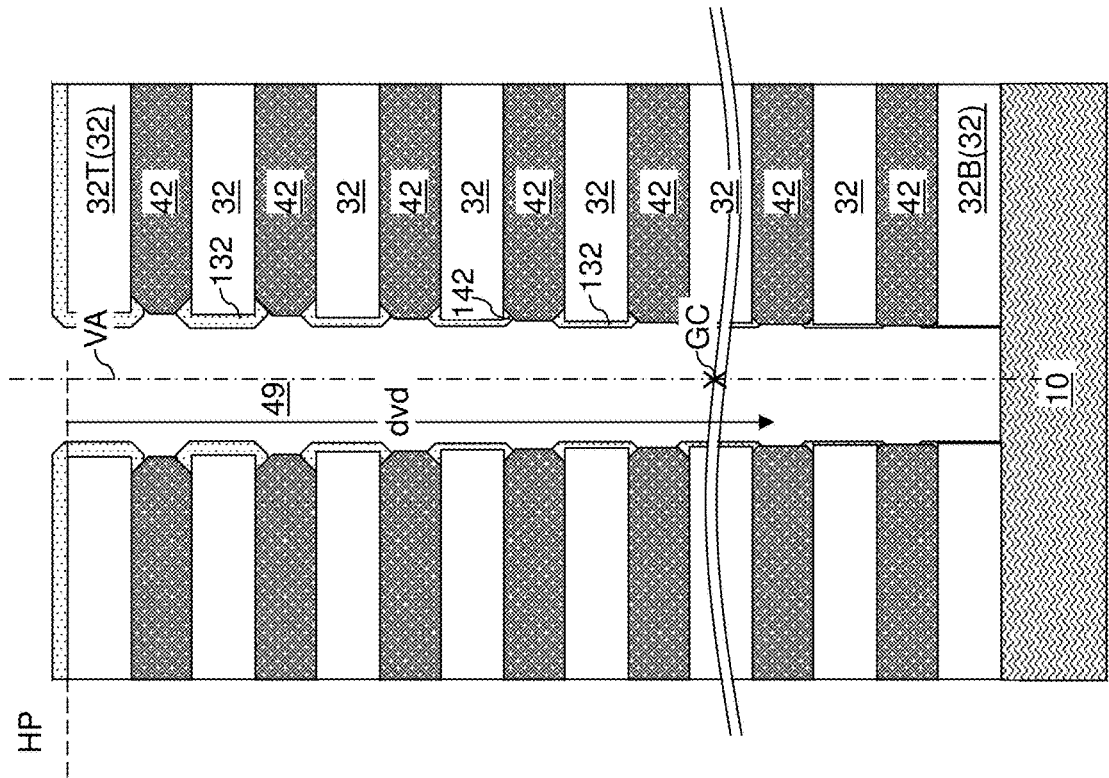
FIGS. 12A-12H are sequential schematic vertical cross-sectional views of a memory opening within a second exemplary structure during formation of a memory opening fill structure according to a second embodiment of the present disclosure.
Figure 12A:
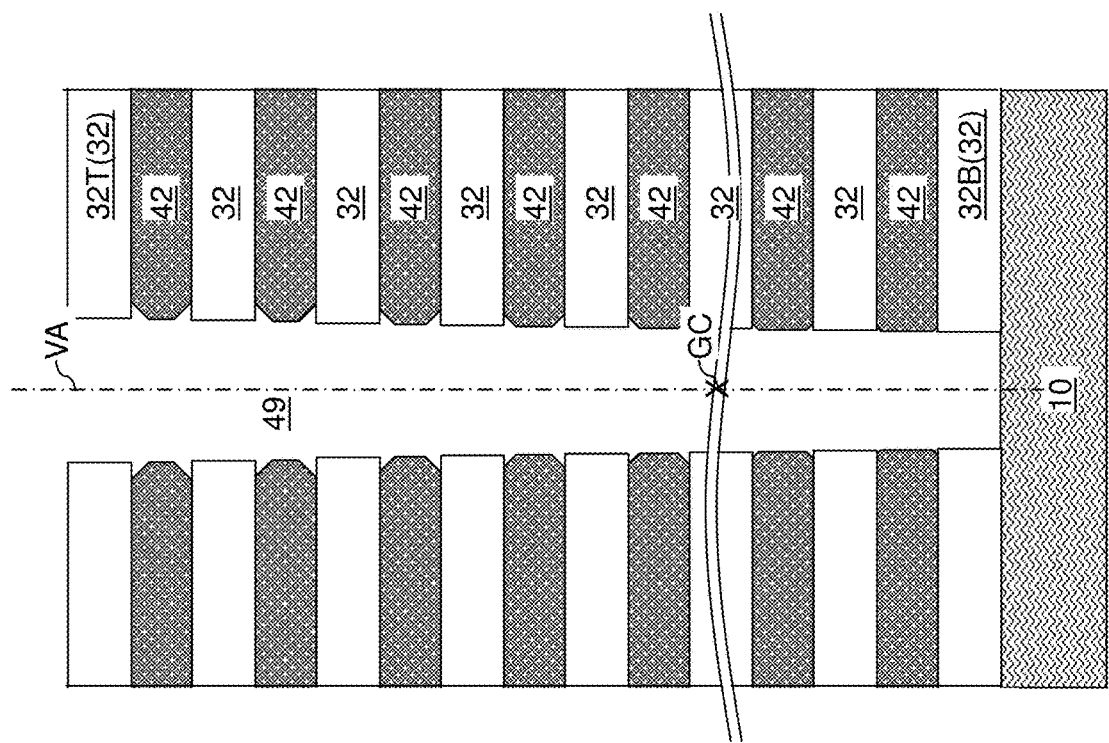

Referring to FIG. 12B, the processing steps described with reference to FIG. 5C can be performed. Specifically, a selective material deposition process can be performed, which grows a second insulating material from physically exposed surfaces of the insulating layers 32 while suppressing growth of the second insulating material from physically exposed surfaces of the sacrificial material layers 42. Deposited portions of the second insulating material in each memory opening 49 or in each support opening 19 form a vertical stack of insulating spacers 132.

Figure 12D:
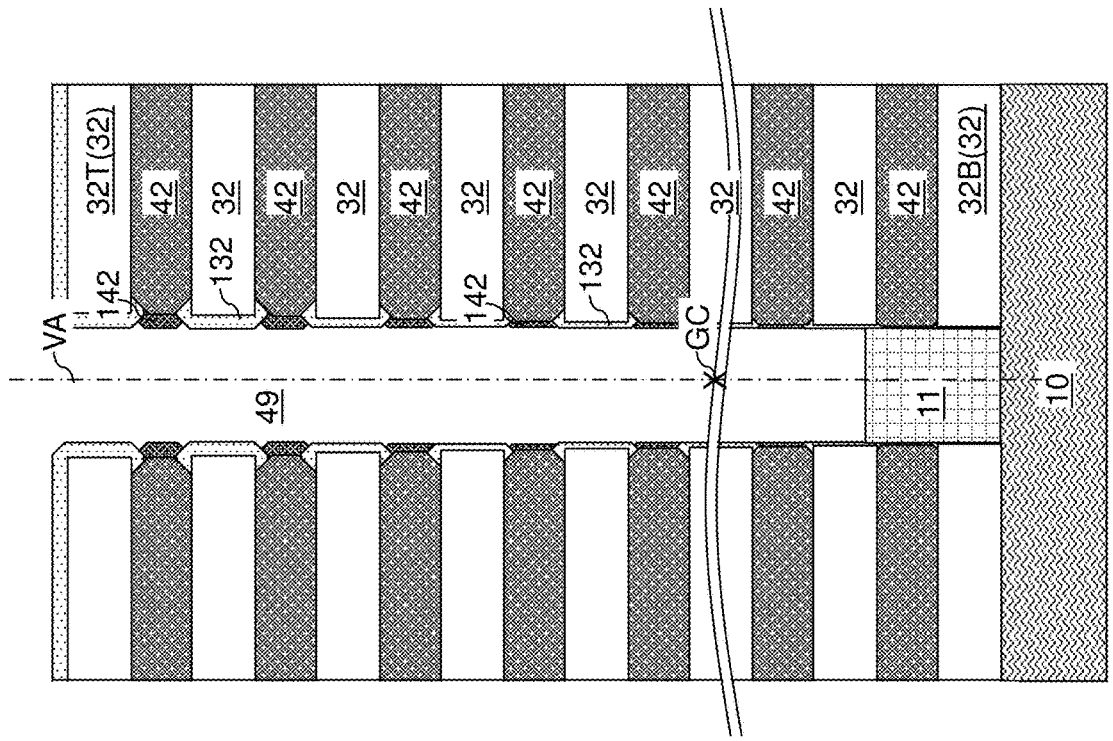
Figure 12C:
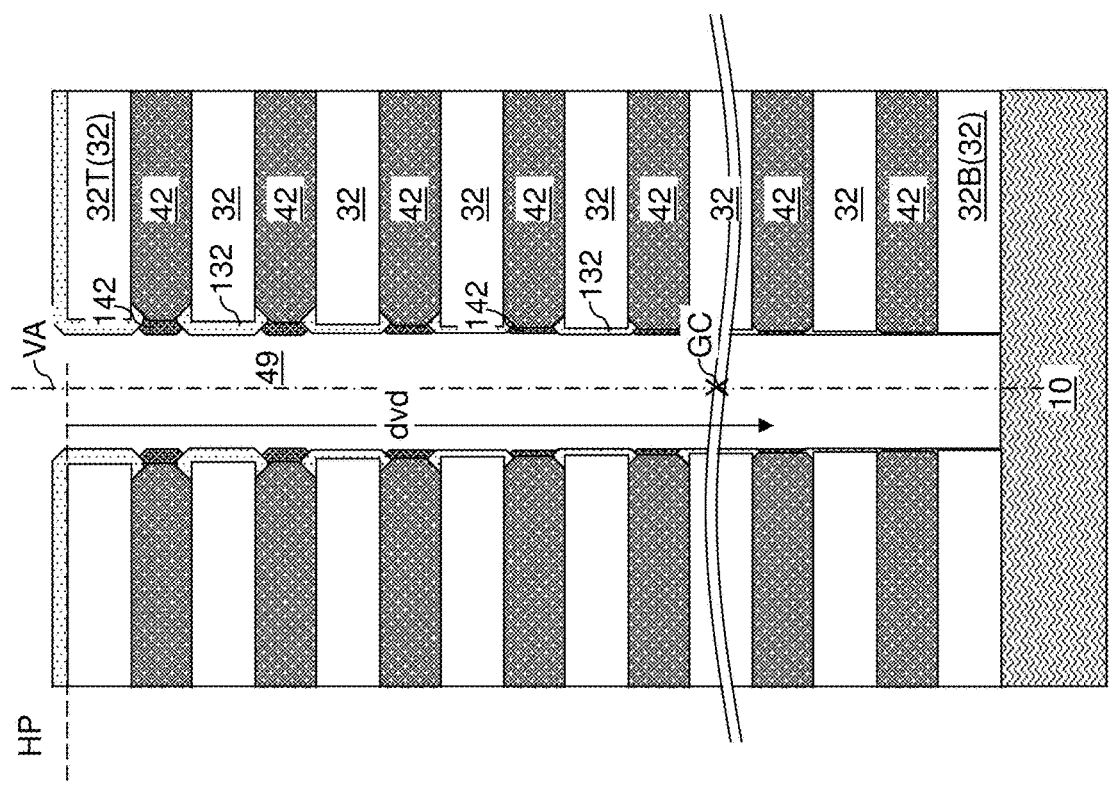

Referring to FIG. 12C, the processing steps described with reference to FIG. 5B can be performed. Specifically, a selective material deposition process can be performed, which grows a second sacrificial material from physically exposed surfaces of the sacrificial material layers 42 while suppressing growth of the second sacrificial material from physically exposed surfaces of the insulating spacers 132. Deposited portions of the second sacrificial material in each memory opening 49 or in each support opening 19 form a vertical stack of sacrificial material spacers 142.

Referring to FIG. 12D, the processing steps described with reference to FIG. 5D can be performed to form a pedestal channel portion 11 at the bottom of each memory opening 49 and at the bottom of each support opening 19.

Figure 12F:
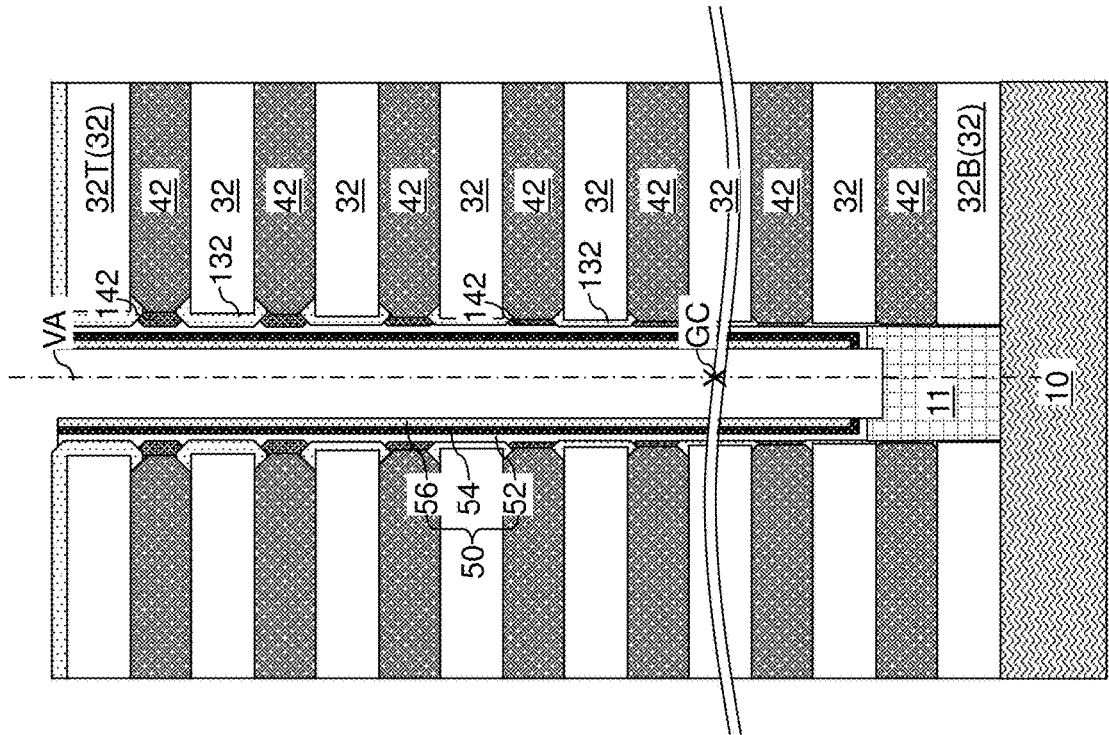
Figure 12E:
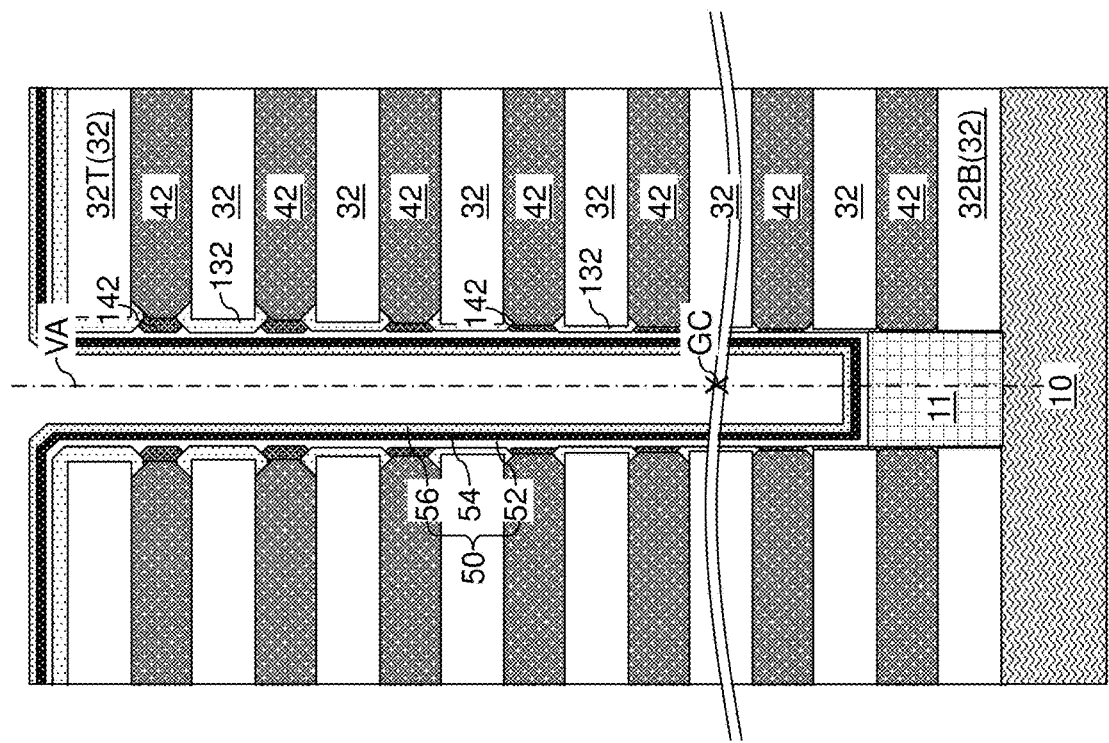

Referring to FIG. 12E, the processing steps described with reference to FIG. 5E can be performed to form a memory film 50 in each memory opening 49 and in each support opening 19.

Referring to FIG. 12F, the processing steps described with reference to FIG. 12F can be performed to remove horizontally-extending portions of the memory film 50 and to physically expose a semiconductor material at the bottom of each memory cavity within a respective memory opening 49.

Figure 12H:
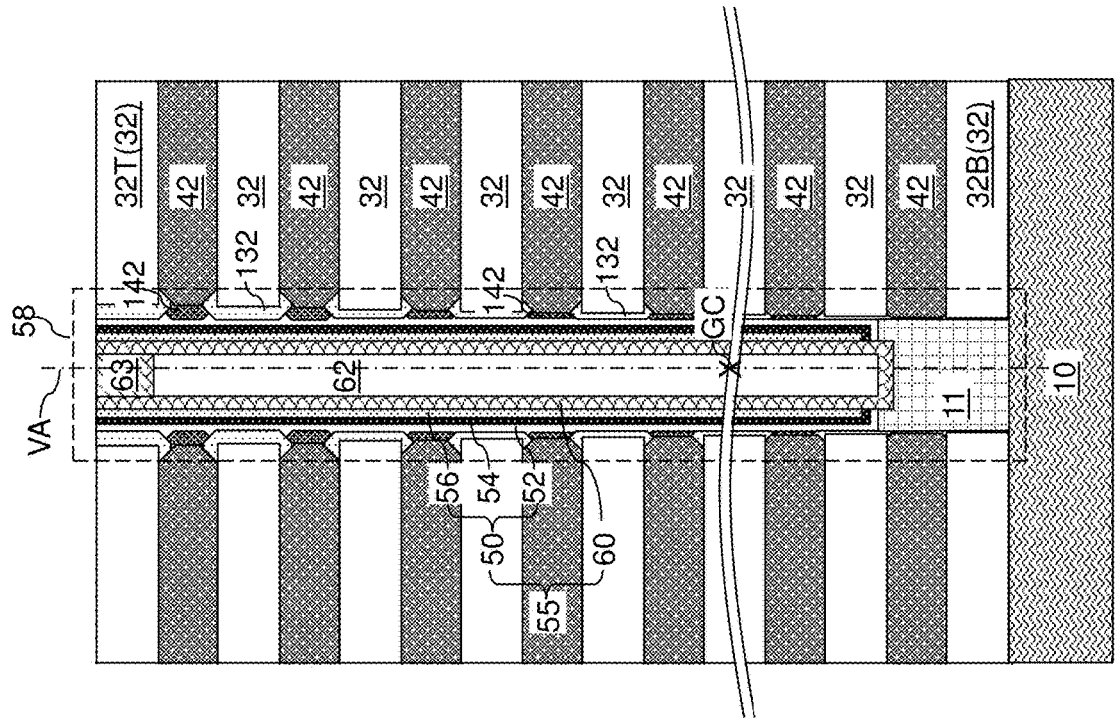
Figure 12G:
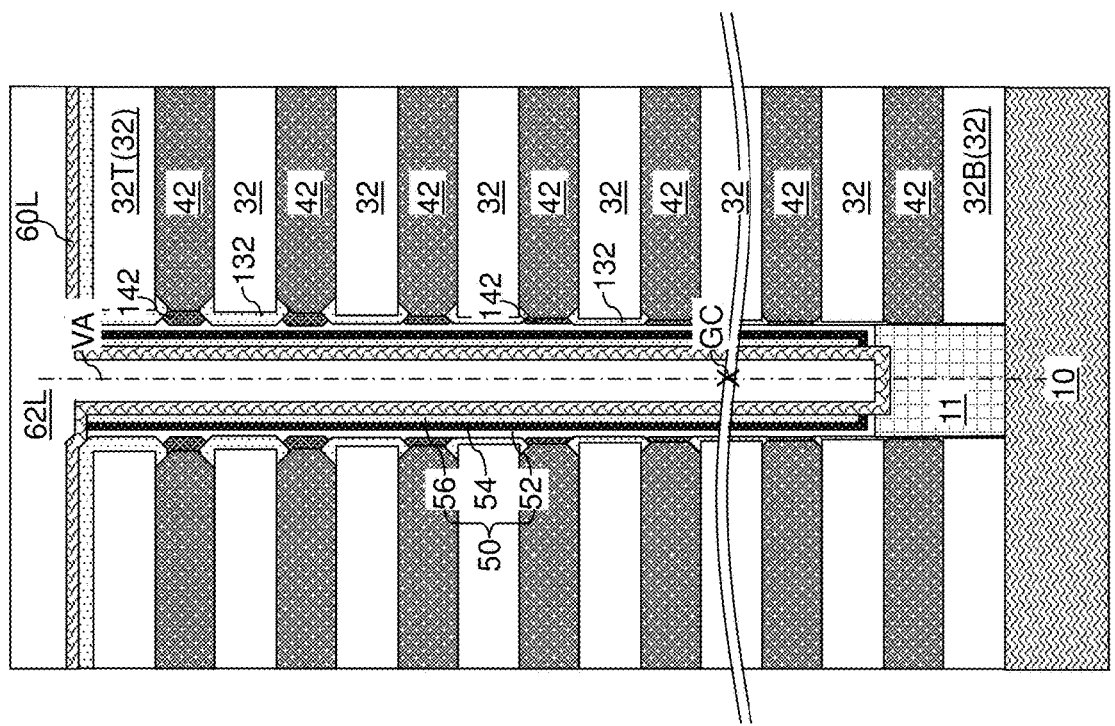

Referring to FIG. 12G, the processing steps described with reference to FIG. 12G can be performed to form a semiconductor channel layer 60L and a dielectric core layer 62L within each of the memory openings 49 and within each of the support openings 19.

Referring to FIG. 12H, the processing steps described with reference to FIG. 12H can be performed to form a memory opening fill structure 58 within each memory opening 49, and to form a support pillar structure 20 within each support opening 19.

Figure 13:
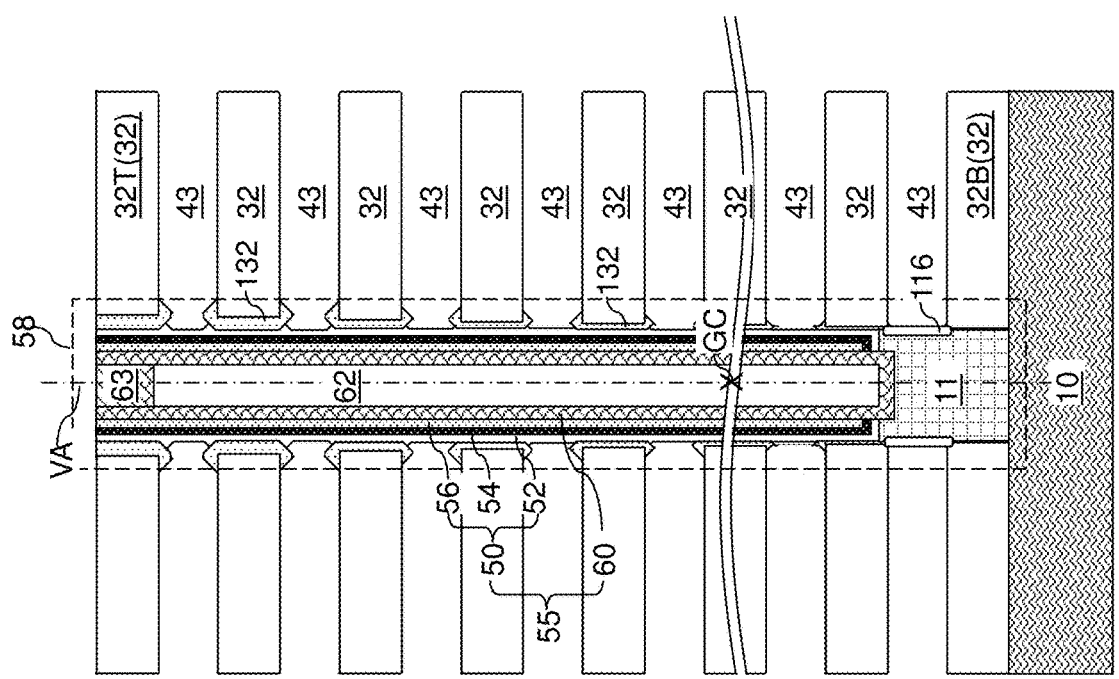
FIG. 13 is a vertical cross-sectional view of a region around a memory opening fill structure in the second exemplary structure after formation of backside recesses according to the second embodiment of the present disclosure.

Referring to FIG. 13, the processing steps described with reference to FIGS. 7A and 7B can be performed to form a contact-level dielectric layer 80, backside trenches 79, and source regions 61. The processing steps described with reference to FIGS. 8A and 8B can be performed to form backside recesses 43 and tubular dielectric spacers 116.

Figure 14:
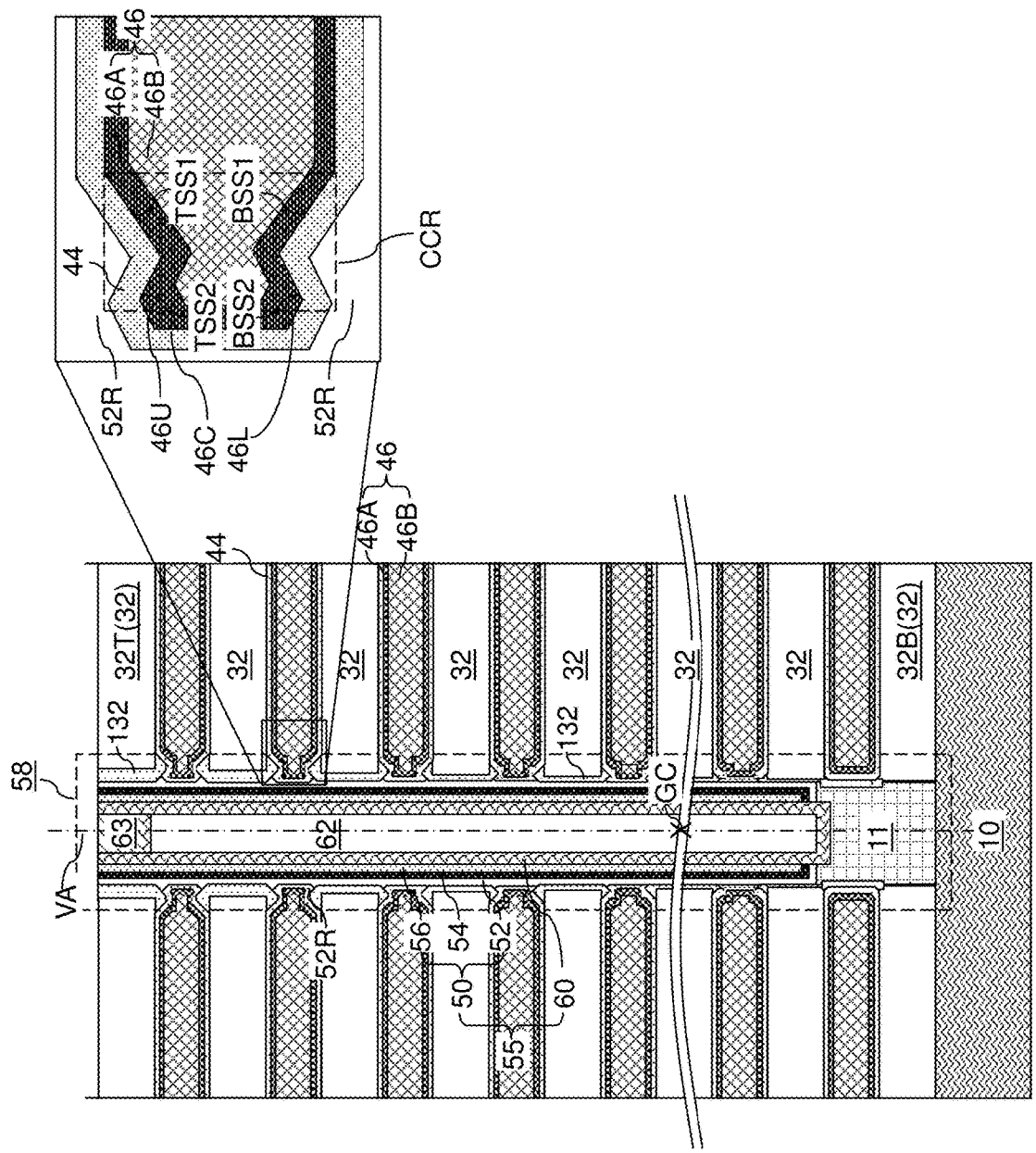
FIG. 14 is a vertical cross-sectional view of a region around a memory opening fill structure in the second exemplary structure after formation of electrically conductive layers according to the second embodiment of the present disclosure.

Referring to FIG. 14, the processing steps described with reference to FIGS. 9A, 9B and 9C, 10A and 10B, and 11A and 11B can be performed.

Generally, the combination of the vertical stacks of sacrificial material spacers 142 and the sacrificial material layers 42 can be replaced with the electrically conductive layers 46. Thus, an alternating stack (32, 46) of insulating layers 32 and electrically conductive layers 46 can be formed over a substrate 8. A memory opening 49 vertically extends through the alternating stack (32, 46). A memory opening fill structure 58 can be located in the memory opening 49. The memory opening fill structure 58 comprises a vertical stack of memory elements and a vertical semiconductor channel 60.

Each electrically conductive layer 46 within an upper subset of the electrically conductive layers 46 including a topmost electrically conductive layer 46 comprises a respective cylindrical surface 46C that laterally surrounds the memory opening fill structure 58, an upper tapered annular surface 46U adjoined to an upper periphery of the respective cylindrical surface 46C, and a lower tapered annular surface 46L adjoined to a lower periphery of the respective cylindrical surface 46C. At least one of a lower subset of the electrically conductive layers 46 may lack the upper and lower tapered surfaces, and may include only the cylindrical surface facing the memory opening fill structure 58.

In one embodiment, the upper tapered annular surfaces 46U within the upper subset of the electrically conductive layers 46 have different vertical extents that increase in magnitude with a vertical distance from a top surface of the substrate 8. In one embodiment, the cylindrical surfaces 46C within the upper subset of the electrically conductive layers 46 have different vertical extents that decrease in magnitude with a vertical distance from a top surface of the substrate 8. In one embodiment, each electrically conductive layer 46 within the upper subset of the electrically conductive layers 46 have a same vertical extent between a respective horizontal top surface and a respective horizontal bottom surface. In other words, the electrically conductive layers 46 may have the same thickness, and the fraction of the vertical extent of the cylindrical surfaces of the electrically conductive layers 46 relative to the thickness of each electrically conductive layer 46 can decrease with a vertical distance from the horizontal plane including the top surface of the substrate 8 (or from the horizontal plane including the top surface of the semiconductor material layer 10). The fraction of the vertical extent of the upper tapered annular surfaces 46U of the electrically conductive layers 46 relative to the thickness of each electrically conductive layer 46 can increase with a vertical distance from the horizontal plane including the top surface of the substrate 8 (or from the horizontal plane including the top surface of the semiconductor material layer 10). The fraction of the vertical extent of the lower tapered annular surfaces 46L of the electrically conductive layers 46 relative to the thickness of each electrically conductive layer 46 can increase with a vertical distance from the horizontal plane including the top surface of the substrate 8 (or from the horizontal plane including the top surface of the semiconductor material layer 10).

In one embodiment, the memory opening fill structure 58 comprises a vertical stack of annular lateral recesses as described above with respect to FIG. 8B. Each electrically conductive layer 46 within a subset of the electrically conductive layers 46 protrudes inward (i.e., toward a vertical axis VA passing through a geometrical center GC of the memory opening fill structure 58) into a respective annular lateral recess of the annular lateral recesses.

In one embodiment, one, a plurality and/or each of the electrically conductive layers 46 within the upper subset of the electrically conductive layers 46 may comprise a horizontal top surface having a first periphery that is adjoined to a top periphery of the upper tapered annular surface 46U of the electrically conductive layer 46, and a horizontal bottom surface having a second periphery that is adjoined to a bottom periphery of the lower tapered annular surface 46S of the electrically conductive layer 46.

In one embodiment shown in FIG. 14, one, a plurality and/or each of the electrically conductive layers 46 may comprise a horizontally-extending portion having a uniform vertical thickness throughout, and a contoured connection region CCR interposed between the horizontally-extending region and a combination of the upper tapered annular surface 46U of the electrically conductive layer 46 and the lower tapered annular surface 46L of the electrically conductive layer 46. In one embodiment, a top surface of the contoured connection region CCR has an asymmetric V-shaped vertical cross-sectional profile in which a first top surface segment TSS1 is longer than a second top surface segment TSS2, and a bottom surface of the contoured connection region has an inverted asymmetric V-shaped vertical cross-sectional profile in which a first bottom surface segment BSS1 is longer than a second bottom surface segment BSS2.

In one embodiment, the memory opening fill structure 58 comprise a vertical stack of insulating spacers 132 that are vertically spaced apart from each other and contacting a respective one of the insulating layers 32. In one embodiment, lateral thicknesses of the insulating spacers 132 of the vertical stack of insulating spacers 132 increases with a vertical distance from a top surface of the substrate 8. In one embodiment, at least one insulating spacer 132 of the vertical stack of insulating spacers 132 has a middle portion having an inner sidewall and an outer sidewall that are parallel to each other, an upper portion having upper tapered surfaces that are adjoined to each other at an annular top periphery, and a lower portion having lower tapered surfaces that are adjoined to each other at an annular bottom periphery. Such an insulating spacer 132 may have a vertical cross-sectional shape of a vertically-elongated hexagon.

In one embodiment, the memory opening fill structure 58 comprises a layer stack of a blocking dielectric layer 52, a memory material layer 54, and a dielectric liner 56; the vertical stack of memory elements comprises portions of the memory material layer 54; and an outer sidewall of the memory material layer 54 has a lesser taper angle relative to a vertical direction than a taper angle of surface segments of the memory opening fill structure 58 that contact a respective one of the insulating layers 32 relative to the vertical direction.

In one embodiment, the blocking dielectric layer 52 comprises a vertical stack of annular rib portions 52R at levels of the subset of the electrically conductive layers 46; and two annular rib portions 52R are provided per each electrically conductive layer 46 within the subset of the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:
    forming an alternating stack of insulating layers comprising a first insulating material and sacrificial material layers comprising a first sacrificial material over a substrate;
    forming a memory opening through the alternating stack;
    performing a first selective material deposition process that selectively grows a second sacrificial material from physically exposed surfaces of the sacrificial material layers to form a vertical stack of sacrificial material portions;
    forming a memory opening fill structure in the memory opening, wherein the memory opening fill structure comprises a vertical stack of memory elements and a vertical semiconductor channel; and
    replacing a combination of the vertical stack of sacrificial material portions and the sacrificial material layers with electrically conductive layers.

2. The method of claim 1, wherein the first selective material deposition process comprises a non-conformal depletive atomic layer deposition process in which a thickness of the deposited second sacrificial material decreases with a downward vertical distance from a horizontal plane including a topmost surface of the alternating stack.

3. The method of claim 1, wherein:
    the first sacrificial material comprise a first silicon nitride material deposited by plasma enhanced chemical vapor deposition; and
    the second sacrificial material comprises a second silicon nitride material deposited by atomic layer deposition.

4. The method of claim 1, further comprising performing a second selective material deposition process that selectively grows a second insulating material from physically exposed surfaces of the insulating layers to form vertical stack of insulating spacers.

5. The method of claim 4, wherein:
    the second selective material deposition process comprises a non-conformal depletive atomic layer deposition process in which a thickness of the deposited second insulating material decreases with a downward vertical distance from a horizontal plane including a topmost surface of the alternating stack;
    lateral thicknesses of the insulating spacers of the vertical stack of insulating spacers increases with a vertical distance from a top surface of the substrate; and
    at least one insulating spacer of the vertical stack of insulating spacers has a middle portion having an inner sidewall and an outer sidewall that are parallel to each other, an upper portion having upper tapered surfaces that are adjoined to each other at an annular top periphery, and a lower portion having lower tapered surfaces that are adjoined to each other at an annular bottom periphery.

6. The method of claim 1, wherein the vertical stack of sacrificial material portions has a variable lateral thickness that increases with a lateral distance from a vertical axis passing through a geometrical center of a volume of the memory opening.

7. The method of claim 1, wherein each electrically conductive layer within an upper subset of the electrically conductive layers including a topmost electrically conductive layer comprises a respective cylindrical surface that laterally surrounds the memory opening fill structure, an upper tapered annular surface adjoined to an upper periphery of the respective cylindrical surface, and a lower tapered annular surface adjoined to a lower periphery of the respective cylindrical surface.

8. The method of claim 7, wherein:
    the upper tapered annular surfaces within the upper subset of the electrically conductive layers have different vertical extents that increase in magnitude with a vertical distance from a top surface of the substrate;
    the cylindrical surfaces within the upper subset of the electrically conductive layers have different vertical extents that decrease in magnitude with a vertical distance from a top surface of the substrate; and
    each electrically conductive layer within the upper subset of the electrically conductive layers has a same vertical extent between a respective horizontal top surface and a respective horizontal bottom surface.

9. The method of claim 7, wherein an electrically conductive layer within the upper subset of the electrically conductive layers comprises:
    a horizontally-extending portion having a uniform vertical thickness throughout; and
    a contoured connection region located between the horizontally-extending region and a combination of the upper tapered annular surface of the electrically conductive layer and the lower tapered annular surface of the electrically conductive layer, wherein a top surface of the contoured connection region has an asymmetric V-shaped vertical cross-sectional profile in which a first top surface segment is longer than a second top surface segment, and a bottom surface of the contoured connection region has an inverted asymmetric V-shaped vertical cross-sectional profile in which a first bottom surface segment is longer than a second bottom surface segment.

10. The method of claim 7, wherein:
    the memory opening fill structure comprises a layer stack of a blocking dielectric layer, a memory material layer, and a dielectric liner;
    the vertical stack of memory elements comprises portions of the memory material layer;
    an outer sidewall of the memory material layer has a lesser taper angle relative to a vertical direction than a taper angle of surface segments of the memory opening fill structure that contact a respective one of the insulating layers relative to the vertical direction;
    the blocking dielectric layer comprises a vertical stack of annular rib portions at levels of the upper subset of the electrically conductive layers; and
    two annular rib portions are provided per each electrically conductive layer within the upper subset of the electrically conductive layers.

11. A memory device, comprising:
an alternating stack of insulating layers and electrically conductive layers located over a substrate;
a memory opening vertically extending through the alternating stack; and
a memory opening fill structure located in the memory opening and comprising a vertical stack of memory elements and a vertical semiconductor channel,
wherein each electrically conductive layer within an upper subset of the electrically conductive layers including a topmost electrically conductive layer comprises a respective cylindrical surface that laterally surrounds the memory opening fill structure, an upper tapered annular surface adjoined to an upper periphery of the respective cylindrical surface, and a lower tapered annular surface adjoined to a lower periphery of the respective cylindrical surface.

12. The memory device of claim 11, wherein:
the upper tapered annular surfaces within the upper subset of the electrically conductive layers have different vertical extents that increase in magnitude with a vertical distance from a top surface of the substrate;
the cylindrical surfaces within the upper subset of the electrically conductive layers have different vertical extents that decrease in magnitude with a vertical distance from a top surface of the substrate; and
each electrically conductive layer within the upper subset of the electrically conductive layers has a same vertical extent between a respective horizontal top surface and a respective horizontal bottom surface.

13. The memory device of claim 11, wherein the memory opening fill structure further comprises a vertical stack of insulating spacers that are vertically spaced apart from each other and contacting a respective one of the insulating layers.

14. The memory device of claim 13, wherein lateral thicknesses of the insulating spacers of the vertical stack of insulating spacers increases with a vertical distance from a top surface of the substrate.

15. The memory device of claim 14, wherein:
the insulating layers comprise a first silicon-oxide-based insulating material; and
the vertical stack of insulating spacers comprises a second silicon-oxide-based insulating material.

16. The memory device of claim 13, wherein at least one insulating spacer of the vertical stack of insulating spacers has a middle portion having an inner sidewall and an outer sidewall that are parallel to each other, an upper portion having upper tapered surfaces that are adjoined to each other at an annular top periphery, and a lower portion having lower tapered surfaces that are adjoined to each other at an annular bottom periphery.

17. The memory device of claim 11, wherein an electrically conductive layer within the upper subset of the electrically conductive layers comprises a horizontal top surface having a first periphery that is adjoined to a top periphery of the upper tapered annular surface of the electrically conductive layer, and a horizontal bottom surface having a second periphery that is adjoined to a bottom periphery of the lower tapered annular surface of the electrically conductive layer.

18. The memory device of claim 11, wherein an electrically conductive layer within the upper subset of the electrically conductive layers comprises:
a horizontally-extending portion having a uniform vertical thickness throughout; and
a contoured connection region located between the horizontally-extending region and a combination of the upper tapered annular surface of the electrically conductive layer and the lower tapered annular surface of the electrically conductive layer.

19. The memory device of claim 18, wherein:
a top surface of the contoured connection region has an asymmetric V-shaped vertical cross-sectional profile in which a first top surface segment is longer than a second top surface segment; and
a bottom surface of the contoured connection region has an inverted asymmetric V-shaped vertical cross-sectional profile in which a first bottom surface segment is longer than a second bottom surface segment.

20. The memory device of claim 11, wherein:
the memory opening fill structure comprises a layer stack of a blocking dielectric layer, a memory material layer, and a dielectric liner;
the vertical stack of memory elements comprises portions of the memory material layer;
an outer sidewall of the memory material layer has a lesser taper angle relative to a vertical direction than a taper angle of surface segments of the memory opening fill structure that contact a respective one of the insulating layers relative to the vertical direction;
the blocking dielectric layer comprises a vertical stack of annular rib portions at levels of the upper subset of the electrically conductive layers; and
two annular rib portions are provided per each electrically conductive layer within the upper subset of the electrically conductive layers.

* * * * *